United States Patent [19]
Usami et al.

[11] Patent Number: 5,388,073
[45] Date of Patent: Feb. 7, 1995

[54] SEMICONDUCTOR INTEGRATED CIRCUIT DEVICE AND DIGITAL PROCESSOR EMPLOYING THE SAME

[75] Inventors: Masami Usami, Nishitama; Akihisa Uchida, Higashiyamato; Yoshino Sakai, Sakaemachi; Masato Iwabuchi, Hachioji, all of Japan

[73] Assignee: Hitachi, Ltd., Tokyo, Japan

[21] Appl. No.: 685,196

[22] Filed: Apr. 15, 1991

[30] Foreign Application Priority Data

Apr. 16, 1990 [JP] Japan ................................ 2-99996

[51] Int. Cl.⁶ .......................... G11C 8/00; G11C 7/00
[52] U.S. Cl. ........................ 365/230.03; 365/230.09; 365/189.04
[58] Field of Search ........ 365/230.05, 230.08, 365/230.09, 189.04, 205, 230.03, 207; 307/530, 355, 356

[56] References Cited

U.S. PATENT DOCUMENTS

| | | | |
|---|---|---|---|
| 4,683,555 | 7/1987 | Pinkham | 365/230.05 |
| 4,914,630 | 4/1990 | Fujishima et al. | 365/189.04 |
| 5,014,242 | 5/1991 | Akimoto et al. | 365/230.05 X |
| 5,043,947 | 8/1991 | Oshima et al. | 365/230.03 |

Primary Examiner—Eugene R. LaRoche
Assistant Examiner—Son Dinh
Attorney, Agent, or Firm—Antonelli, Terry, Stout & Kraus

[57] ABSTRACT

A semiconductor memory device for use in a digital data processor together with a central processing unit (CPU) receives address signals which are validated for a time period n times as long as the machine cycle of the CPU, and it stores therein input data items which are validated for a cycle equal to the machine cycle of the CPU or delivers therefrom output data items which are validated for a cycle equal to the machine cycle of the CPU.

19 Claims, 25 Drawing Sheets

SEMICONDUCTOR INTEGRATED CIRCUIT DEVICE AND DIGITAL PROCESSOR EMPLOYING THE SAME

CROSS-REFERENCE TO RELATED APPLICATION

Ser. No. 07/351,044 filed by Akimoto et al., assigned to Hitachi, Ltd., discloses a semiconductor integrated circuit device comprising a pair of memory blocks, in which while one memory block is accessed for a read operation, the other memory block is accessed for a write operation.

BACKGROUND OF THE INVENTION

This invention relates to semiconductor integrated circuit devices, memory devices, and digital data processors. More particularly, it relates to techniques which are especially effective when applied to, for example, a high-speed memory device such as a memory with logic functions including random access memory (RAM) macrocells or a vector register including the memories with logic functions, and a high-speed computer including high-speed memory devices.

A bipolar type static RAM is basically constructed of memory arrays in each of which bipolar type memory cells are arranged in the shape of a matrix. In addition, a high-speed memory device, e.g., a vector register, includes such bipolar type static RAMs and is used for predetermined vector operations, and a high-speed computer includes such high-speed memory devices.

A bipolar type static RAM is stated in, for example, "LSI HANDBOOK" edited by the Corporate Society of Telecommunication, published by the Ohm-sha, Ltd. in 1984, pp. 507-512.

SUMMARY OF THE INVENTION

In a high-speed computer or the like, address signals necessary for accesses, input data, etc. are supplied to a high-speed memory device, such as a vector register or cache memory, in synchronism with the machine cycle of the high-speed computer or the like. Accordingly, it has been found that, in shortening the machine cycle of the high-speed computer or the like, the access time and cycle time of the high-speed memory device itself need to be shortened.

On the other hand, the data bit width of the high-speed memory device or the like is held in correspondence with the instruction word length and operation bit length of the high-speed computer or the like, and the number of addresses thereof exerts a great influence on a bit rate in, for example, the cache memory. Accordingly, it has been found that, in enhancing the operating performance of the high-speed computer or the like and curtailing the overhead thereof, the storage capacity of the high-speed memory device needs to be enlarged.

As is well known, the enlargement of the storage capacity of the high-speed memory device increases stray capacitances coupled to word lines and data lines. Especially in a write mode, it prolongs a time period for the inversion of the level of a signal on the data line, and it prolongs time periods for setting up a write pulse and the input data as well as the address signal and for holding them. In this regard, the inventors' study has revealed the following problem: Particularly in the bipolar type static RAM as mentioned above, the cycle time of the write mode can extend several times as long as the access time of a read mode. This results in lengthening the access time and cycle time of the high-speed memory device, so that the machine cycle of the high-speed computer or the like is limited.

An object of this invention is to provide a semiconductor integrated circuit device, such as a memory with logic functions, which has the storage capacity thereof enlarged while the substantial access time and cycle time thereof are shortened.

Another object of this invention is to enlarge the storage capacity of a high-speed memory device, such as vector a register or cache memory, including memories with logic functions while the access time and cycle time thereof are shortened.

A further object of this invention is to shorten the machine cycle of a high-speed computer or the like including a high-speed memory device and thus enhance the operating performance thereof.

The above and other objects and novel features of this invention will become apparent from the description of this specification when read in conjunction with the accompanying drawings.

A typical aspect of performance of this invention will be briefly summarized below:

A high-speed memory device, such as a vector register or cache memory, to be disposed in a high-speed computer or the like is basically constructed of a memory with logic functions, or the like, comprising n memories which are formed on an identical semiconductor substrate, the access time or cycle time of which is set n times as long as the machine cycle of the high-speed computer or the like, to which address spaces not overlapping in the n memories are allocated, which are started sequentially, for example, every machine cycle, and which can operate in parallel.

According to the above expedient, the substantial access time or cycle time of the memory with logic functions or the like as viewed from the high-speed computer or the like can be set at one machine cycle irrespective of the operation modes thereof. Therefore, the high-speed memory device or the like has the storage capacity thereof enlarged while the cycle time thereof is shortened. Thus, the machine cycle of the high-speed computer or the like comprising the high-speed memory device can be shortened, and the processing capacbility and operating performance thereof can be enhanced.

DESCRIPTION OF THE PREFERRED EMBODIMENTS

Basic Construction and Block Arrangement of Memory with Logic Functions

Parallel Shift Access Mode

Figure 1:
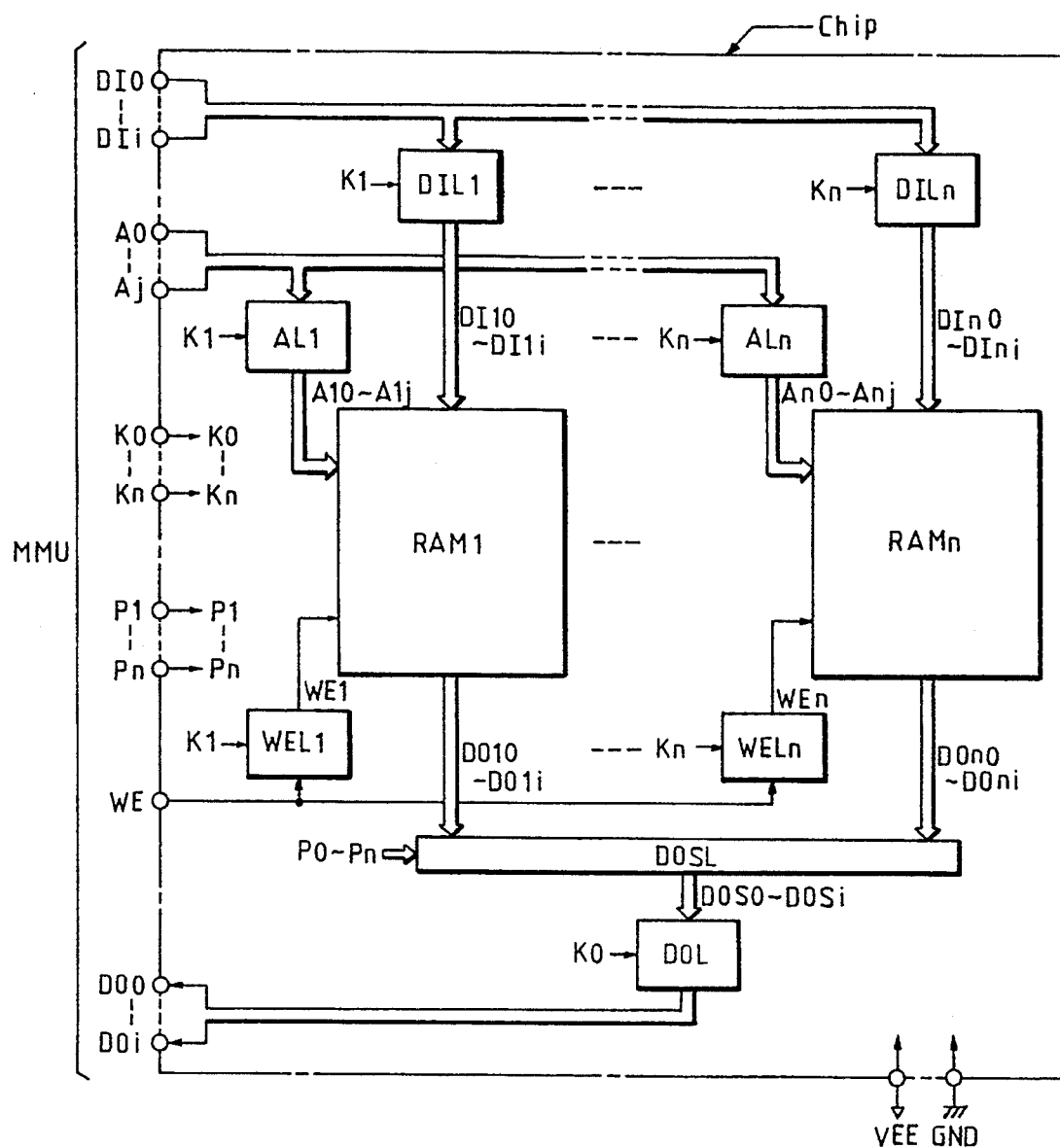
FIG. 1 is a fundamental conceptual diagram showing the first embodiment of a memory with logic functions to which this invention is applied.

FIG. 1 shows a fundamental conceptual diagram of the first embodiment of a memory with logic functions to which this invention is applied. In addition, FIG. 2 exemplifies a timing chart of the operation of the memory with logic functions in FIG. 1. The basic construction, general operation and features of the memory with logic functions in this embodiment will be described with reference to these figures. By the way, although not especially restricted, each of memories with logic functions to be described in the ensuing embodiments constitutes a high-speed memory device, such as vector register, included in a digital processor, such as high-speed computer, in the form of a single article or a plurality of articles combined. Also, although not especially restricted, circuit elements shown in each of the drawings illustrative of the ensuing embodiments and circuit elements constituting individual blocks similarly shown are formed on a single semiconductor substrate (a single chip) of, e.g., single-crystal silicon as indicated by the enclosure thereof with a dot-and-dash line in FIG. 1. Besides, in FIG. 1, circular marks (o) denote external terminals for receiving signal inputs or delivering signal outputs or external terminals for supplying power source voltages (GND and VEE). In this regard, it is to be understood that, although external terminals similar to those of the embodiment in FIG. 1 are also provided in each of the embodiments in FIGS. 3, 5, 7, 9, 11, 13, 15, 16 and 17, they are omitted from illustration for the brevity of the drawing. Further, in the circuit diagrams to be referred to below, a MOSFET (which is short for a "metal-oxide-semiconductor field effect transistor" and which shall be the generic name of insulated-gate field effect transistors here in this specification) which has an arrow affixed to its channel (back gate) portion is of the P-channel type, and it is shown in distinction from an N-channel MOSFET to which no arrow is affixed. All of bipolar transistors (hereinbelow, simply termed "transistors") shown in the diagrams are N-P-N transistors though no special restriction is meant.

Referring to FIG. 1, a memory with logic functions is shown which comprises n random access memories RAM1–RAMn formed as macrocells on a common semiconductor substrate, though not especially restricted. Although no special restriction is intended, each of the random access memories is made up of a bipolar type static RAM which has a comparatively large storage capacity, and it is basically constructed of a memory array in which a large number of bipolar type memory cells are arranged in the shape of a matrix.

In this embodiment, the read operation of the memory with logic functions proceeds at a comparatively high speed. The cycle time of the memory with logic functions in the read mode thereof is set so as to be capable of corresponding to the machine cycle of the high-speed computer, though no special restriction is intended. On the other hand, the write operation of the memory with logic functions requires substantially n times the access time of the read mode, namely, the n machine cycles of the high-speed computer because this memory has a comparatively large storage capacity and expends a comparatively long time on the inversion of the signal levels of data lines. In other words, the number n of the random access memories is set in correspondence with the number n of the machine cycles necessary for the write operation of the memory with logic functions, and these random access memories are operated in parallel, whereby the substantial cycle time of the memory with logic functions in all the operation modes thereof is held in correspondence with the machine cycle of the high-speed computer.

Further, in this embodiment, the number n of the random access memories is set at any number of the power of 2 though not especially restricted. In addition, a series of consecutive address spaces are successively and alternately allocated to the random access memories RAM1-RAMn, so that the address spaces assigned to the individual random access memories do not overlap one another.

Although no special restriction is meant, the memory with logic functions receives address signals of $(j+1)+\log_2 n$ bits generated by the central processing unit (CPU) of the high-speed computer and sent through an internal address bus (IB) to which the CPU is coupled, as well as a memory management unit (MMU) which is coupled to the internal address bus. Among the address signals, ones A0-Aj of $j+1$ bits are supplied to the random access memories RAM1-RAMn in common, as will be described later, while the remaining ones of $\log_2 n$ bits are decoded by the memory management unit (MMU). On the basis of the decoded signals, there are selectively formed internal clock signals K1-Kn for alternatively bringing the random access memories RAM1-RAMn into operating states, pitch signals P1-Pn, and a write enable signal WE. Although not especially restricted, the memory with logic functions is further supplied with input data items DI0-DIi of $i+1$ bits from the memory management unit (MMU). Besides, data items read out of the designated addresses of the memory with logic functions are transmitted to the memory management unit (MMU) as output data items DO0-DOi of $i+1$ bits, which are further sent to the CPU of the high-speed computer through the internal data bus (IB) thereof.

Here, although not especially restricted, the various signals which are supplied as the inputs to or the outputs from the memory with logic functions are afforded as ECL levels and have their amplitude set at a comparatively small value, for example, 0.8 V. As exemplified in FIG. 2, an internal clock signal K0 among these signals is formed of a train of pulses synchronized with the machine cycles of the high-speed computer, while the internal clock signals K1-Kn are respectively formed of trains of pulses generated by dividing the frequency of the internal clock signal K0 into 1/n and shifting phases every machine cycle. Besides, although not especially restricted, the write enable signal WE is changed with n machine cycles as its period, and it is set at the high one of the ECL levels selectively when the memory with logic functions is held in the write mode. Further, although not especially restricted, the pitch signals P1-Pn are changed with one machine cycle as their period and with their respective delays of $\frac{1}{2}$ machine cycle relative to the corresponding pulses of the internal clock signal K0. Meanwhile, the address signals A0-Aj are changed with n machine cycles as their period as exemplified in FIG. 2 when the series of consecutive addresses of the memory with logic functions are successively designated.

Although no special restriction is meant, the address signals A0-Aj afforded as the inputs to the memory with logic functions are supplied in common to n address latches AL1-ALn which are respectively disposed in correspondence with the random access memories RAM1-RAMn. The address latches AL1-ALn are respectively supplied with the corresponding internal clock signals K1-Kn. Thus, as exemplified in FIG. 2, the address signals A0-Aj are sequentially accepted into the corresponding address latches AL1-ALn in accordance with the internal clock signals K1-Kn, and each of them is held for the time period of n machine cycles. The output signals of the address latches AL1-ALn are respectively supplied to the corresponding random access memories RAM1-RAMn as internal address signals A10-A1j thru An0-Anj. As stated before, the random access memories RAM1-RAMn are alternatively brought into the operating states in accordance with the address signals of $\log_2 n$ bits other than the address signals A0-Aj. Therefore, even in a case where the address signals A0-Aj common to all random access memories are supplied, for example, where an address $A_p$ is designated, the substantial addresses of the memory with logic functions as designated by the internal address signals A10-A1j thru An0-Anj are shifted so as to correspond to, for example, addresses $A_{p+0}$ thru $A_{p+n-1}$.

Likewise, the input data items DI0-DIi are supplied in common to n input data latches DIL1-DILn which are respectively disposed in correspondence with the random access memories RAM1-RAMn. These input data latches are further supplied with the corresponding internal clock signals K1-Kn, respectively. Thus, as exemplified in FIG. 2, the input data items DI0-DIi are sequentially accepted into the corresponding input data latches DIL1-DILn in accordance with the internal clock signals K1-Kn, and each of them is held for the time period of n machine cycles. The output signals of the input data latches DIL1-DILn are respectively supplied to the corresponding random access memories RAM1-RAMn as internal input data items DI10-DI1i thru DIn0-DIni. Needless to say, these internal input data items are contents, for example, $(A_{q+0})$-$(A_{q+n-1})$ to be written into addresses $A_{q+0}$-$A_{q+n-1}$.

Meanwhile, the write enable signal WE is supplied in common to n write enable signal latches WEL1-WELn which are respectively disposed in correspondence with the random access memories RAM1-RAMn. These write enable signal latches are respectively supplied with the corresponding internal clock signals K1-Kn. Thus, as exemplified in FIG. 2, the write enable WE is sequentially accepted into the corresponding write enable signal latches WEL1-WELn in accordance with the internal clock signals K1-Kn, and each of them is held for the time period of n machine cycles. The output signals of the write enable signal latches WEL1-WELn are respectively supplied to the corresponding random access memories RAM1-RAMn as internal write enable signals WE1-WEn.

The internal address signals A10-A1j thru An0-Anj supplied to the random access memories RAM1-RAMn are decoded by the address decoders of the corresponding random access memories, respectively. As a result, the random access memories RAM1-RAMn are brought into substantial selected states and bring $(i+1)$ memory cells corresponding to the designated addresses into selected states. On this occasion, when the corresponding internal write enable signals WE1-WEn are set at the low one of the ECL levels, the random access memories RAM1-RAMn read out the stored data items of the selected memory cells. In contrast, when the corresponding internal write enable signals WE1-WEn are set at the high level, the random access memories RAM1-RAMn further form predetermined write pulses and then execute the operations of writing the internal input data items DI10-DI1i thru DIn0-DIni into the selected memory cells.

Although no special restriction is intended, the stored data items of $(i+1)$ bits read out of the designated addresses of the random access memories RAM1-RAMn are respectively supplied to the corresponding input terminals of an output selector circuit DOSL as internal output data items DO10–DO1i thru DOn0–DOni. The output selector circuit DOSL is further supplied with the pitch signals P1–Pn. Although not especially restricted, the internal output data items DO10–DO1i thru DOn0–DOni have their levels established in the latter halves of the individual machine cycles as exemplified in FIG. 2.

The output selector circuit DOSL decodes the pitch signals P1–Pn to alternatively select the internal output data items DO10–DO1i thru DOn0–DOni delivered from the corresponding random access memories, and it transmits the selected data items to an output data latch DOL as internal output data items DOS0–DOSi. The output data latch DOL is further supplied with the internal clock signal K0 though not especially restricted.

The output data latch DOL accepts the internal output data items DOS0–DOSi in accordance with the internal clock signal K0, and sends them to the internal bus (IB) through the memory management unit (MMU) as the output signals of the memory with logic functions, namely, as the output data items DO0–DOi. Consequently, the output data items DO0–DOi are sent from the memory with logic functions to the internal bus (IB) in a machine cycle next to the machine cycle in which the read operations of the corresponding random access memories RAM1–RAMn have been performed.

Figure 2:
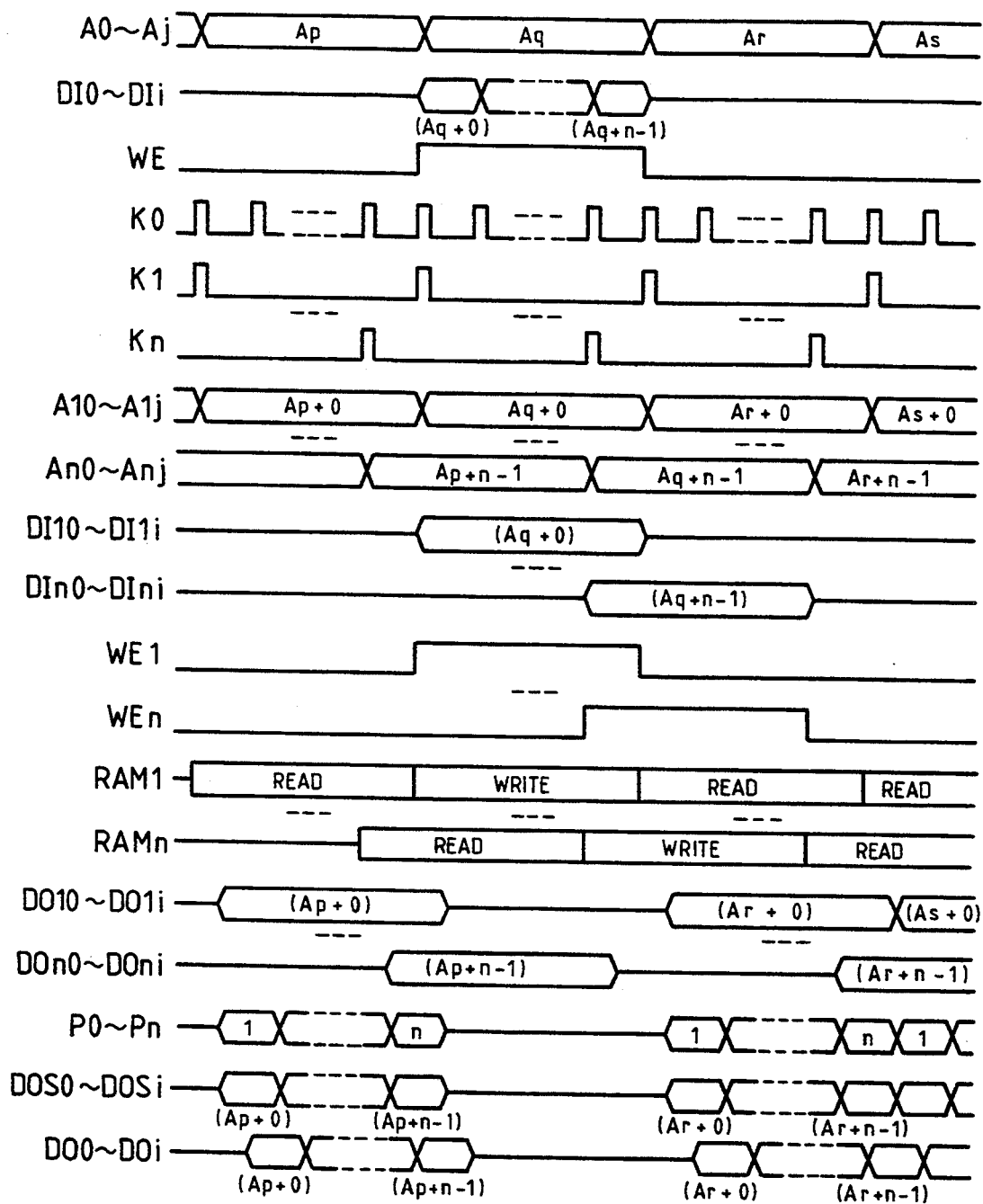
FIG. 2 is a timing chart showing an example of the operation of the memory with logic functions in FIG. 1.

Here, the internal address signals A10–A1j thru An0–Anj which are respectively supplied to the random access memories RAM1–RAMn are changed shifting every machine cycle as exemplified in FIG. 2. Therefore, the individual random access memories RAM1–RAMn are started shifting every machine cycle and are accessed for the read or write operations in parallel during the time period of n machine cycles. Thus, the memory with logic functions in this embodiment operates as a memory with logic functions in a so-called parallel shift access mode. Herein, the substantial cycle time of the memory with logic functions as viewed from the high-speed computer side becomes one machine cycle in any case in spite of the fact that the write operations of all the random access memories require n machine cycles. That is, the operations of the plurality of random access memories RAM1–RAMn formed on the single semiconductor substrate are controlled so that the cycle time of the memory device including the plurality of random access memories RAM1–RAMn may be substantially equalized to one machine cycle of the computer including the memory device. This fact results in shortening the machine cycle of the high-speed computer or the like and enhancing the data processing capability thereof accordingly. Moreover, since each random access memory of the memory with logic functions has a comparatively large storage capacity, the bit width of the whole high-speed memory device and the number of addresses thereof are enlarged. As a result, the operating performance of the high-speed computer or the like can be enhanced, and the overhead thereof is curtailed. In order to equalize the substantial cycle time of the memory with logic functions to one machine cycle as stated above, it becomes a requisite that the addresses to be given to the memory with logic functions are incremented or decremented in succession. Since, however, this addressing condition is oftener realized in the high-speed memory device such as vector register or cache memory, it does not result in adversely increasing the overhead of the high-speed computer or the like.

By the way, in the memory with logic functions in this embodiment, the cycle time thereof in the read modes of the random access memories RAM1–RAMn is set at one machine cycle. However, even in a case where the cycle time is set at 2 to 4 machine cycles, similar effects can be attained. In this case, the phases of the read data items which are delivered from the individual random access memories with delays among them need to be brought into coincidence with those of the pitch signals P1–Pn which are supplied to the output selector circuit DOSL.

Figure 3:
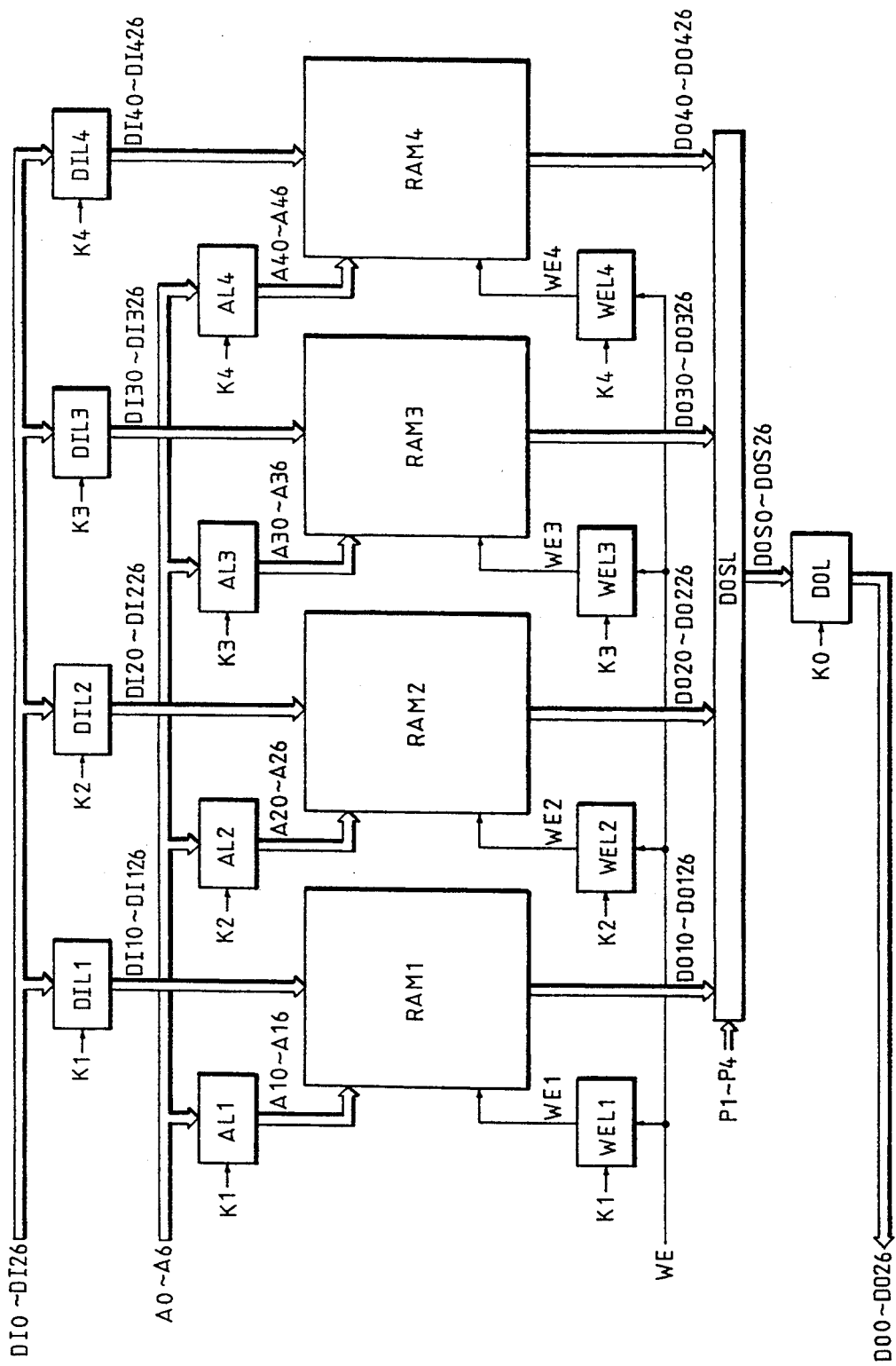
FIG. 3 is a block diagram showing the first practicable embodiment of the memory with logic functions in FIG. 1.
Figure 4:
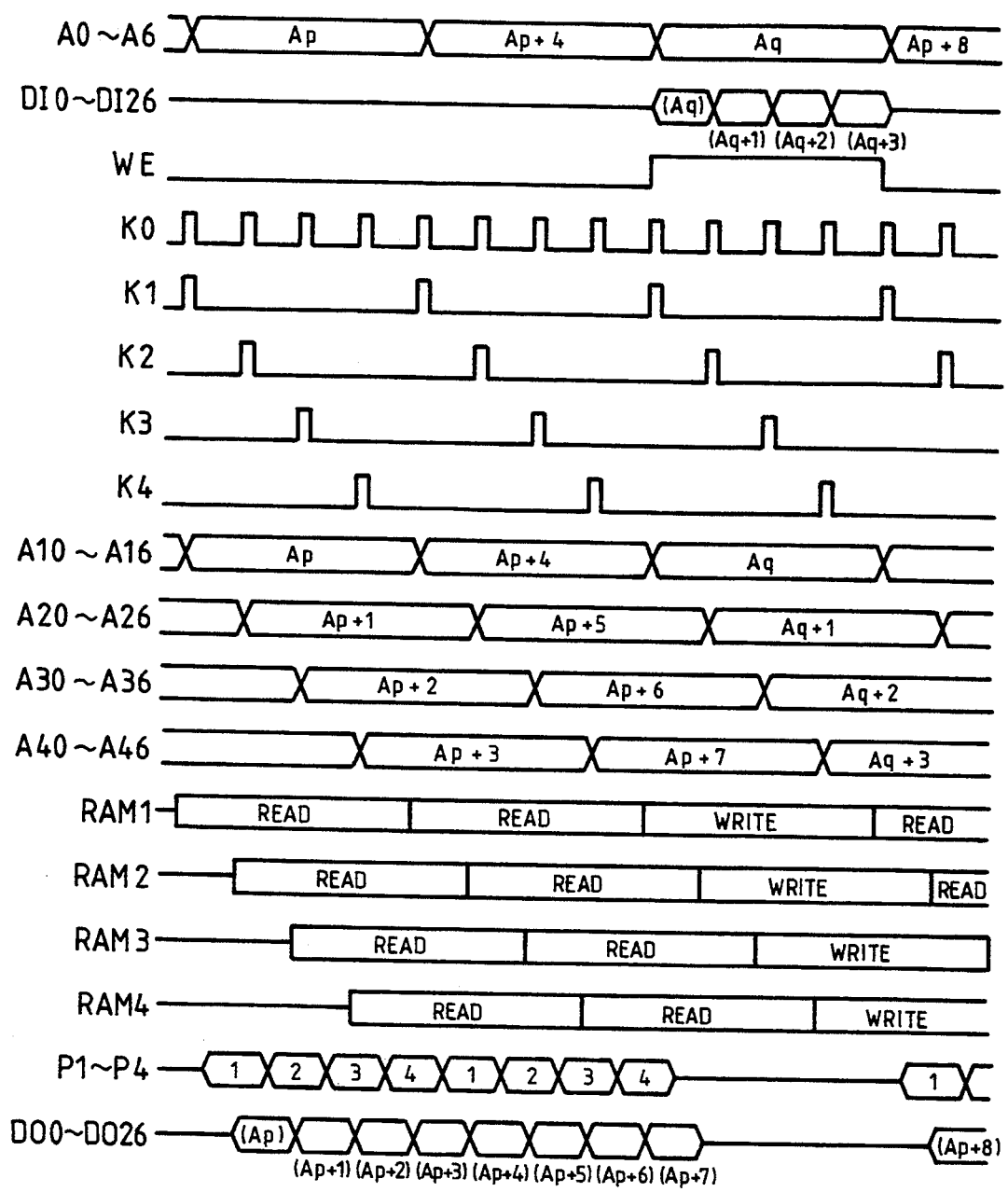
FIG. 4 is a timing chart showing an example of the operation of the memory with logic functions in FIG. 3.

FIG. 3 shows a block diagram of the first practicable embodiment of the memory with logic functions in FIG. 1, namely, the memory with logic functions adopting the parallel shift access mode, while FIG. 4 exemplifies a timing chart of the operation of the embodiment. The practicable example of the block arrangement of the the memory with logic functions adopting the parallel shift access mode and the general operation of this memory will be described with reference to these figures.

Referring to FIG. 3, the memory with logic functions in this embodiment comprises four random access memories RAM1–RAM4 formed on a common semiconductor substrate, that is, the number n of random access memories constituting the memory with logic functions is set at:

$n=4,$ though no special restriction is intended. These random access memories are made up of bipolar type static RAMs though not especially restricted.

On the other hand, although no special restriction is meant, the number of bits i of each of the input data and output data of the memory with logic functions is set at:

$i=27,$ that is, 3 bytes besides the parity bits of 3 bits, and the number of bits j of each address signal is set at:

$j=7.$

As a result, each of the random access memories RAM1–RAM4 is endowed with a storage capacity of 27 bits×128 words, namely, 3456 bits in total, and the whole memory with logic functions is endowed with a storage capacity of 27 bits×512 words, namely, 13824 bits in total.

In this embodiment, the read operations of the random access memories RAM1–RAM4 are quickened so as to be capable of corresponding to the machine cycle of the high-speed computer as exemplified in FIG. 4, and the write operations thereof require a comparatively long time period equivalent to 4 machine cycles as also exemplified, though no special restriction is intended. Therefore, the random access memories RAM1–RAM4 are sequentially started shifting every machine cycle in accordance with internal clock signals K1–K4 and are accessed for the read or write operations in parallel. On this occasion, the operation modes of the respective random access memories are selectively set in accordance with corresponding internal write enable signals WE1–WE4. In addition, the read data items of the respective random access memories are alternatively selected in accordance with pitch signals P1–P4 by an output selector circuit DOSL, whereupon they are sent as the output data items DO0–DO26 of the memory with logic functions to an unshown internal bus in a machine cycle next to the machine cycle in which the read operations have been performed. As a result, the substantial cycle time of the memory with logic functions in each operation mode thereof as viewed from the high-speed computer side becomes one machine cycle in any case in spite of the fact that the write operations of the individual random access memories require 4 machine cycles. This promotes shortening the machine cycle of the high-speed computer accordingly.

Figure 5:
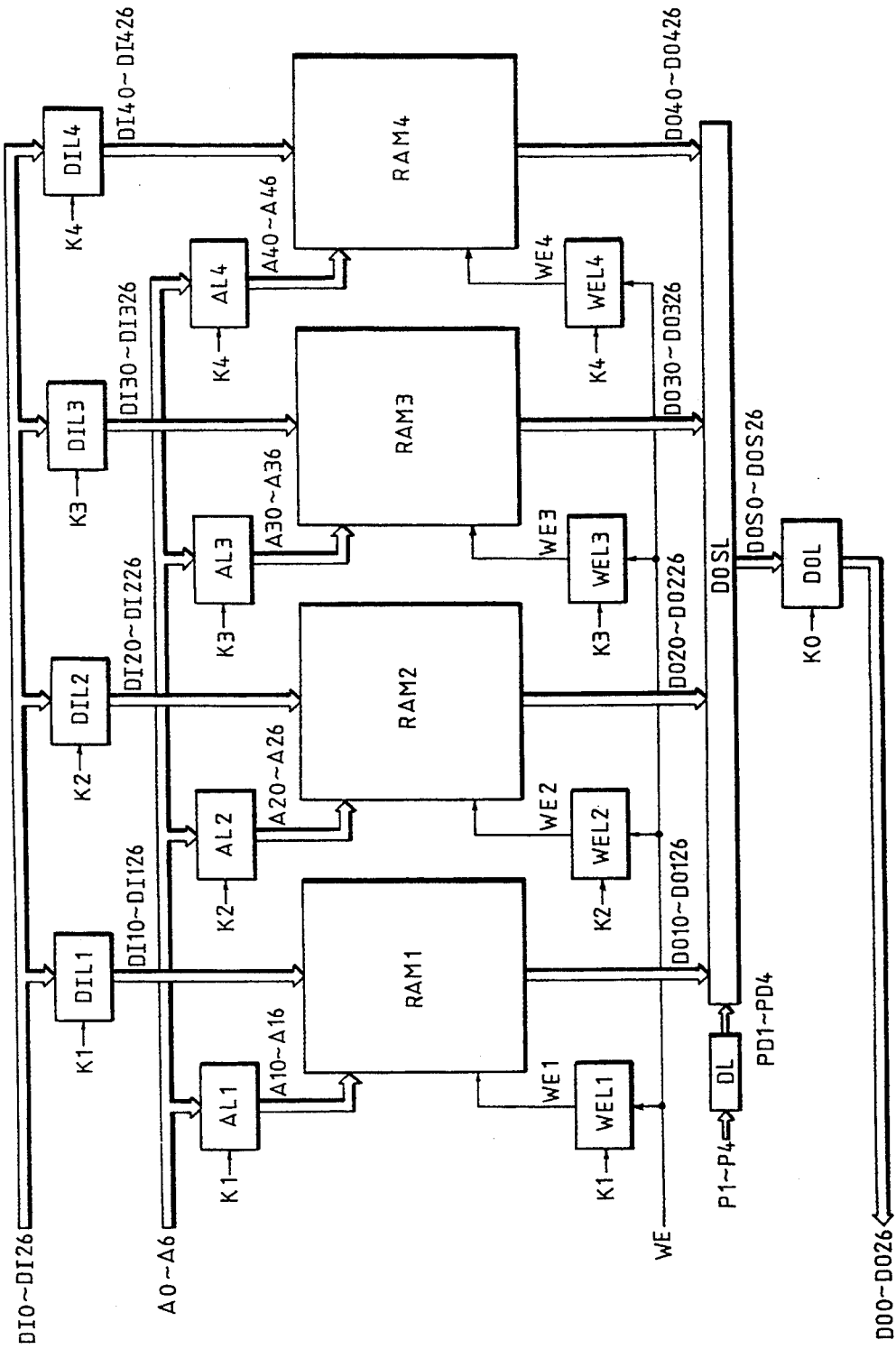
FIG. 5 is a block diagram showing the second practicable embodiment of the memory with logic functions in FIG. 1.
Figure 6:
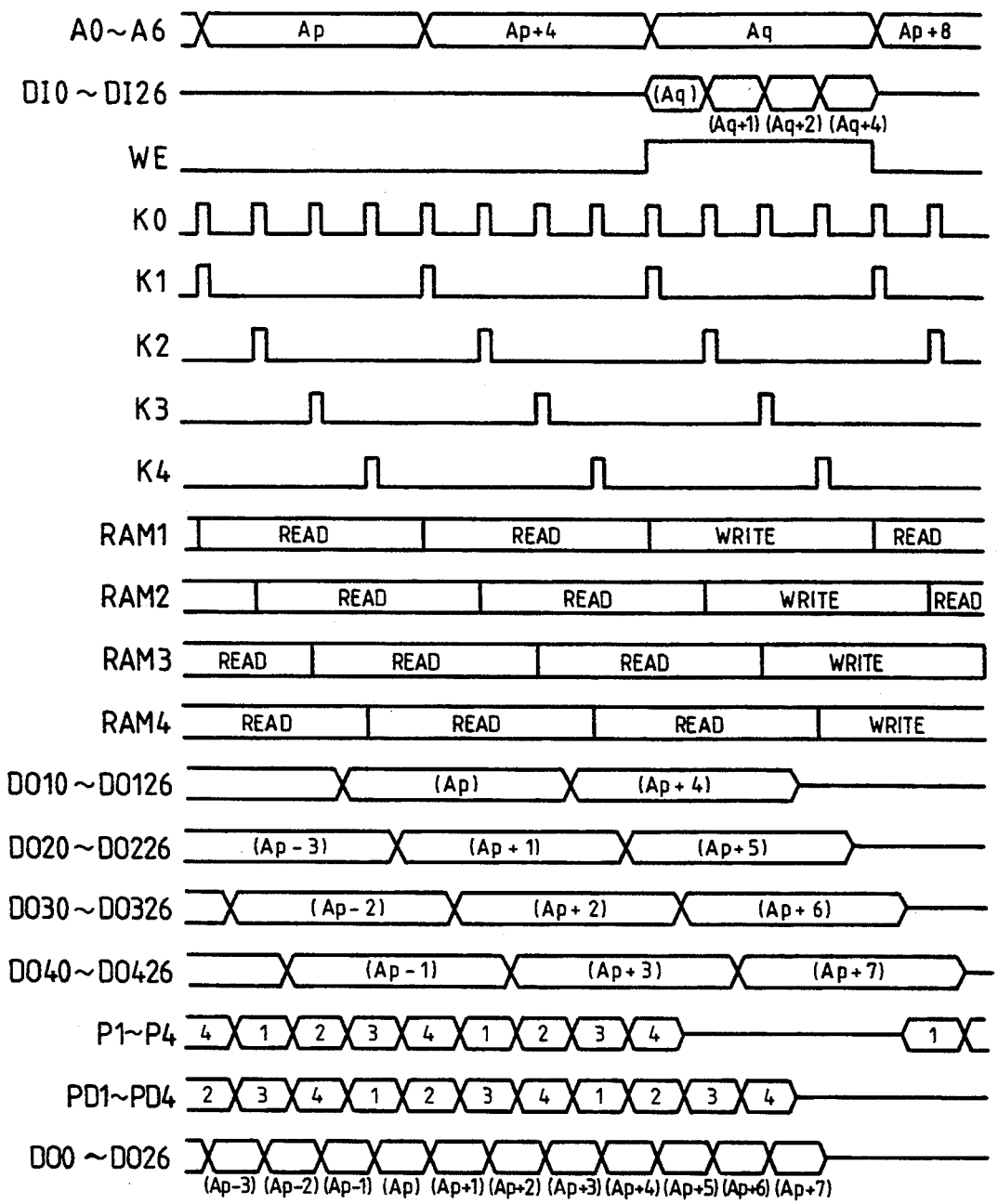
FIG. 6 is a timing chart showing an example of the operation of the memory with logic functions in FIG. 5.

FIG. 5 shows a block diagram of the second practicable embodiment of the memory with logic functions in FIG. 1, namely, the memory with logic functions adopting the parallel shift access mode, while FIG. 6 exemplifies a timing chart of the operation of the embodiment. The second example of the block arrangement of the the memory with logic functions adopting the parallel shift access mode and the general operation of this memory will be described with reference to these figures.

Referring to FIG. 5, as in the embodiment in FIG. 3, the memory with logic functions in this embodiment comprises four random access memories RAM-1–RAM4 formed on a common semiconductor substrate, that is, the number n of random access memories constituting the memory with logic functions is set at:

$n=4,$ though no special restriction is intended. These random access memories are made up of bipolar type static RAMs though not especially restricted.

On the other hand, although no special restriction is meant, the number of bits i of each of input data and output data is set at:

$i=27,$ that is, 3 bytes besides the parity bits of 3 bits, and the number of bits j of each address signal is set at:

$j=7.$

As a result, each of the random access memories RAM-1–RAM4 is endowed with a storage capacity of 27 bits×128 words, namely, 3456 bits in total, and the whole memory with logic functions is endowed with a storage capacity of 27 bits×512 words, namely, 13824 bits in total.

In this embodiment, the read operations of the random access memories RAM1–RAM4 require a comparatively long time period equivalent to 3 machine cycles of the high-speed computer as exemplified in FIG. 6, and the write operations thereof require a comparatively long time period equivalent to 4 machine cycles as also exemplified, though no special restriction is intended. Therefore, the random access memories RAM-1–RAM4 are sequentially started shifting every machine cycle in accordance with internal clock signals K1–K4 and are accessed for the read or write operations in parallel. On this occasion, the operation modes of the respective random access memories are selectively set in accordance with corresponding internal write enable signals WE1–WE4. Besides, as exemplified in FIG. 6, the read data of each random access memory has its level established in the latter half of the second machine cycle after the start of the read operation. Therefore, the memory with logic functions comprises a delay circuit DL which delays pitch signals P1–P4 to form pitch signals PD1–PD4 having delay times of about 2.5 machine cycles, and the operation of selecting the output data items in an output selector circuit DOSL proceeds in accordance with the delayed pitch signals PD1–PD4. Thus, the read data items of the respective random access memories are sent as the output data items DO0–DO26 of the memory with logic functions in the third machine cycle reckoned from the machine cycle in which the read operations have been started.

As the result of the foregoing, the substantial cycle time of the memory with logic functions in each operation mode thereof as viewed from the high-speed computer side becomes one machine cycle in any case in spite of the fact that 3 machine cycles are expended on the read operations of the individual random access memories and that 4 machine cycles are expended on the write operations thereof. This promotes shortening the machine cycle of the high-speed computer accordingly.

2-Bank Mode

Figure 7:
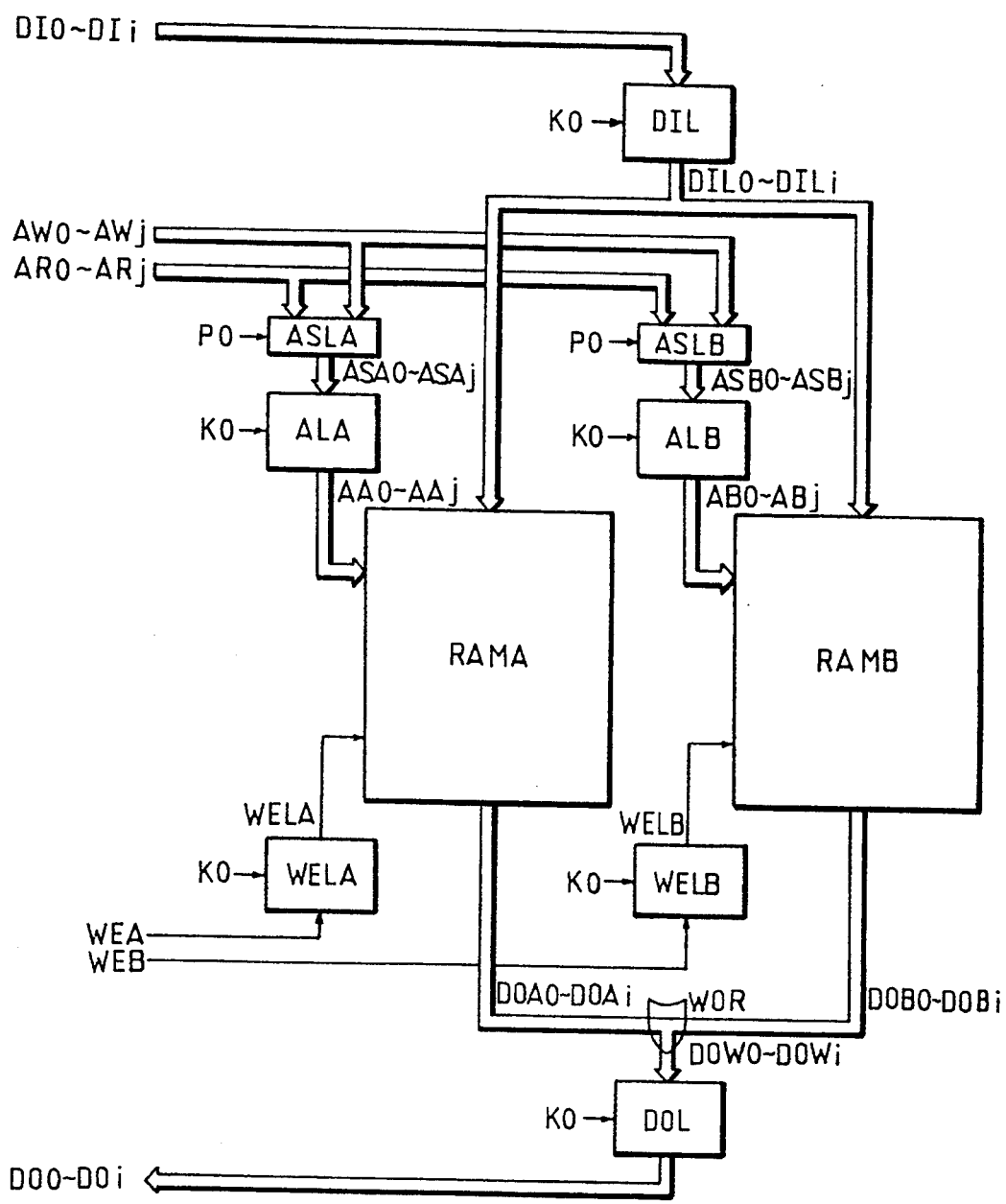
FIG. 7 is a fundamental conceptual diagram showing the second embodiment of a memory with logic functions to which this invention is applied.

FIG. 7 shows a fundamental conceptual diagram of the second embodiment of a memory with logic functions to which this invention is applied. In addition, FIG. 8 exemplifies a timing chart of the operation of the memory with logic functions in FIG. 7. The basic construction, general operation and features of the memory with logic functions in this embodiment will be described with reference to these figures. By the way, although not especially restricted, the memory with logic functions in this embodiment constitutes a high-speed memory device, such as vector register, included in a digital processor, such as high-speed computer, in the form of a single article or a plurality of articles combined, likewise to the first embodiment described above. Now, the description of portions differing from the first embodiment will be supplemented.

Referring to FIG. 7, the memory with logic functions comprises two random access memories RAMA and RAMB formed as macrocells on a common semiconductor substrate, though not especially restricted. Although no special restriction is intended, each of the random access memories is made up of a bipolar type static RAM which has a comparatively large storage capacity, and it is basically constructed of a memory array in which a large number of bipolar type memory cells are arranged in the shape of a matrix.

In this embodiment, the cycle times of the random access memories RAMA and RAMB in the write mode and read mode thereof are both held in correspondence with the machine cycle of the high-speed computer. However, the actual access time of each random access memory in the read mode thereof is as short as, for example, about ½ machine cycle, whereas the actual cycle time in the write mode is so long as to require one entire machine cycle. In other words, the machine cycle of the high-speed computer in this embodiment is restricted by the cycle time of the memory with logic functions in the write mode thereof.

Meanwhile, in this embodiment, the random access memories RAMA and RAMB are alternately and simultaneously accessed in order that, when one of them is held in the read mode, the other may be held in the write mode, though no special restriction is meant. In addition, a series of consecutive address spaces are successively and alternately allocated to the random access memories RAMA and RAMB, so that the address spaces assigned to the individual random access memories do not overlap one another. As a result, a write operation and a read operation for a series of different addresses as required in, for example, the processing of vector operations, can be simultaneously and efficiently executed in such a way that the random access memories RAMA and RAMB are alternately set at the read mode or the write mode while write address signals AW0-AWj and read address signals AR0-ARj are being counted up independently of each other.

Although no special restriction is meant, the memory with logic functions is fed with write address signals and read address signals of (j+1)+1 bits which are sent through an unshown memory management unit from the internal bus of the high-speed computer. As stated before, these address signals are counted up independently of each other in correspondence with the processing of the high-speed computer. Among these address signals, the write address signals AW0-AWj and read address signals AR0-ARj of j+1 bits are supplied to the two random access memories RAMA and RAMB in common, while the address signals of the remaining one bit are decoded by the memory management unit. On the basis of the decoded signals, there are selectively formed a pitch signal and write enable signals WEA and WEB for selectively bringing the random access memories RAMA and RAMB into operating states. The memory with logic functions is further supplied with input data items DI0-DIi of i+1 bits and an internal clock signal K0 through the memory management unit. Besides, the read data items of the memory with logic functions are transmitted to the memory management unit as output data items DO0-DOi of i+1 bits, which are further sent to the internal bus of the high-speed computer.

Figure 8:
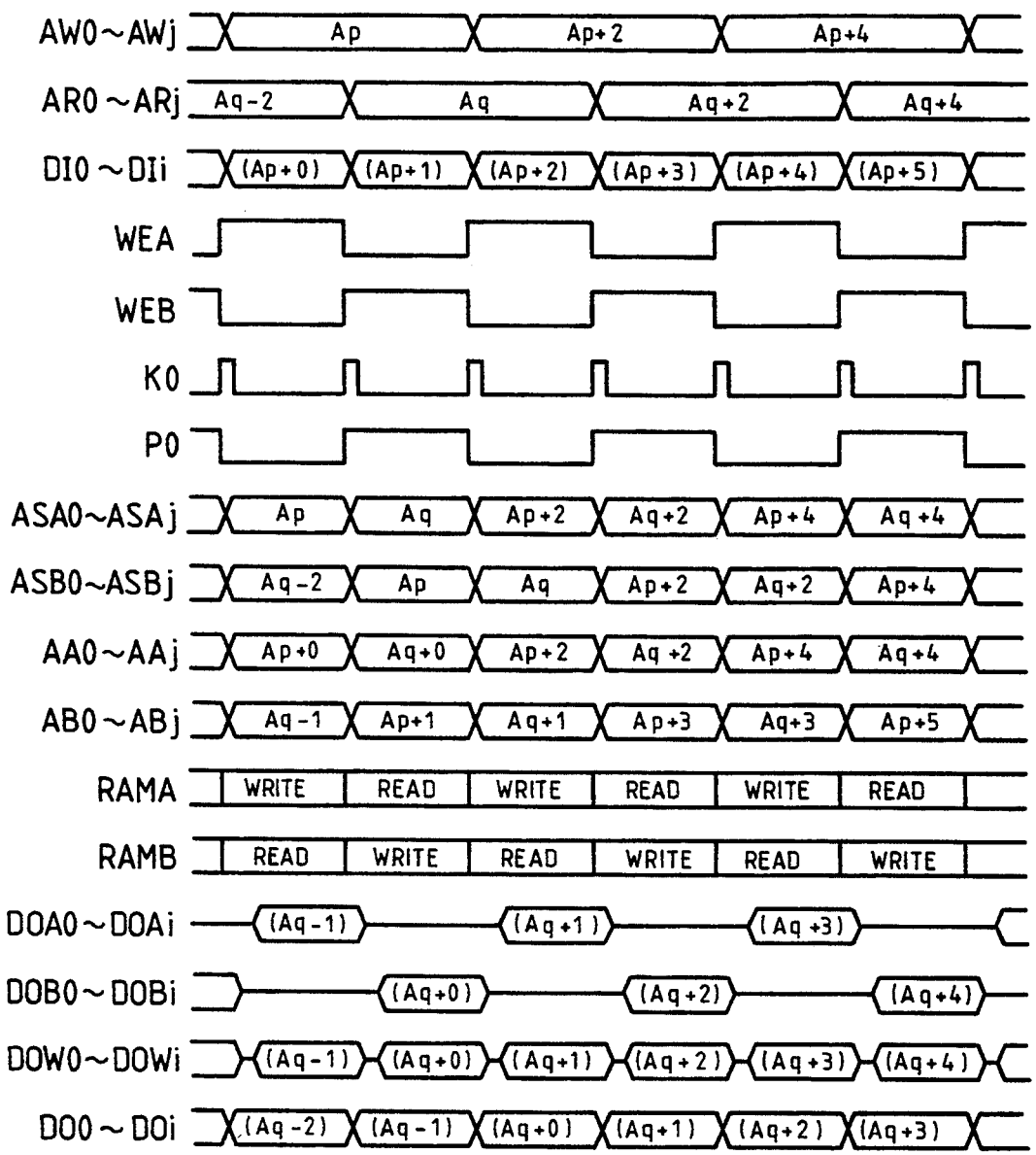
FIG. 8 is a timing chart showing an example of the operation of the memory with logic functions in FIG. 7.

Here, as exemplified in FIG. 8, the internal clock signal K0 is formed of a train of pulses synchronized with the machine cycles of the high-speed computer, while the pitch signal P0 is changed to the low level or the high level in synchronism with the internal clock signal K0. Besides, the write enable signals WEA and WEB are changed every machine cycle in order to alternately bring the random access memories RAMA and RAMB into the read mode or the write mode, and they are selectively set at the high level when the corresponding random access memories are to be brought into the write mode. Further, as exemplified in FIG. 8, the write address signals AW0-AWj are changed with 2 machine cycles as their period, while the read address signals AR0-ARj are changed at the middle points between the changing points of the write address signals and with 2 machine cycles as their period.

Although no special restriction is meant, the write address signals AW0-AWj afforded as the inputs to the memory with logic functions are supplied in common to the input terminals on one side, of two address selector circuits ASLA and ASLB which are respectively disposed in correspondence with the random access memories RAMA and RAMB, and the read address signals AR0-ARj are supplied in common to the input terminals on the other side, of the address selector circuits ASLA and ASLB. These address selector circuits are further supplied with the pitch signal P0. The output signals of the address selector circuits ASLA and ASLB are respectively supplied to corresponding address latches ALA and ALB as internal address signals ASA0-ASAj and ASB0-ASBj. These address latches are further supplied with the internal clock signal K0.

Although no special restriction is intended, the address selector circuit ASLA operates as exemplified in FIG. 8 in such a manner that, when the pitch signal P0 is set at the low level, the write address signals AW0-AWj are selected and are supplied to the corresponding address latch ALA as the internal address signals ASA0-ASAj. On the other hand, when the pitch signal P0 is set at the high level, the read address signals AR0-ARj are selected and are supplied to the corresponding address latch ALA as the internal address signals ASA0-ASAj. These internal address signals are accepted into the address latch ALA and are thereafter supplied to the random access memory RAMA as internal address signals AA0-AAj in accordance with the internal clock signal K0.

Likewise, the address selector circuit ASLB operates in such a manner that, when the pitch signal P0 is set at the low level, the read address signals AR0-ARj are selected contrariwise and are supplied to the corresponding address latch ALB as the internal address signals ASB0-ASBj. On the other hand, when the pitch signal P0 is set at the high level, the write address signals AW0-AWj are selected and are supplied to the corresponding address latch ALB as the internal address signals ASB0-ASBj. These internal address signals are accepted into the address latch ALB and are thereafter supplied to the random access memory RAMB as internal address signals AB0-ABj in accordance with the internal clock signal K0.

Meanwhile, the input data items DI0-DIi are accepted into an input data latch DIL and are thereafter supplied in common to the random access memories RAMA and RAMB as internal input data items DIL-0-DILi in accordance with the internal clock signal K0. Besides, the write enable signals WEA and WEB are accepted into corresponding write enable signal latches WELA and WELB and are thereafter supplied to the corresponding random access memories RAMA and RAMB as internal write enable signals WELA and WELB in accordance with the internal clock signal K0, respectively.

Thus, the random access memories RAMA and RAMB are alternately and simultaneously brought into the write mode or the read mode, and the write address signals AW0-AWj or the read address signals AR0-ARj are selectively transmitted to each random access memory in correspondence with the operation mode thereof. As stated before, the write address signals and the read address signals are changed with 2 machine cycles as their periods. Since, however, the write enable signals WEA and WEB and the pitch signal P0 are selectively formed in accordance with the other address signal of 1 bit, substantial addresses to be designated by the write address signals and by the read address signals shift one by one.

The internal address signals AA0-AAj thru AB0-ABj supplied to the random access memories RAMA and RAMB are decoded by the address decoders of the corresponding random access memories, respectively. As a result, the random access memories RAMA and RAMB are brought into substantial selected states and bring (i+1) memory cells corresponding to the designated addresses into selected states. On this occasion, when the corresponding internal write enable signal WELA or WELB is set at the low level, the random access memory RAMA or RAMB reads out the held data items of the selected memory cells. In contrast, when the corresponding internal write enable signal WELA or WELB is set at the high level, the random access memory further forms a predetermined write pulse and then executes the operation of writing the internal input data items DIL0-DILi into the selected memory cells.

Although no special restriction is intended, the stored data items of (i+1) bits read out of the designated addresses of the random access memories RAMA and RAMB are respectively transmitted to a wired OR circuit WOR as internal output data items DOA0--DOAi and DOB0-DOBi, and they are further supplied to an output data latch DOL as internal output data items DOW0-DOWi. Although not especially restricted, the read data items of the random access memories RAMA and RAMB have their levels established in the first halves of the individual machine cycles and are turned into the output data items DO0-DOi of the memory with logic functions in the succeeding machine cycles as exemplified in FIG. 8.

As described above, the random access memories RAMA and RAMB constituting the memory with logic functions in this embodiment are alternately and simultaneously accessed in the write mode or the read mode. Further, the series of consecutive address spaces are alternately and successively allocated to the random access memories, so that the address spaces of these random access memories do not overlap one another. Thus, the memory with logic functions in this embodiment operates as a memory with logic functions in a so-called 2-bank mode. Herein, a write operation and a read operation for a series of different addresses as required in, for example, the processing of vector operations, can be simultaneously and efficiently executed in such a way that the random access memories RAMA and RAMB are alternately set at the read mode or the write mode while write address signals and read address signals are being counted up independently of each other. On this occasion, the address signals to be afforded to the random access memories RAMA and RAMB are, in effect, curtailed one bit, and their address spaces are equivalently reduced. As a result, a time period for the decode processing of the address signals in each random access memory is shortened, and the cycle time of the memory with logic functions is shortened to that extent. These facts result in shortening the machine cycle of the high-speed computer or the like and enhancing the processing capability thereof accordingly. Moreover, since each random access memory of the memory with logic functions has a comparatively large storage capacity, the bit width of the whole high-speed memory device and the number of addresses thereof are enlarged. In consequence, the operating performance of the high-speed computer or the like can be enhanced, and the overhead thereof is curtailed.

Figure 9:
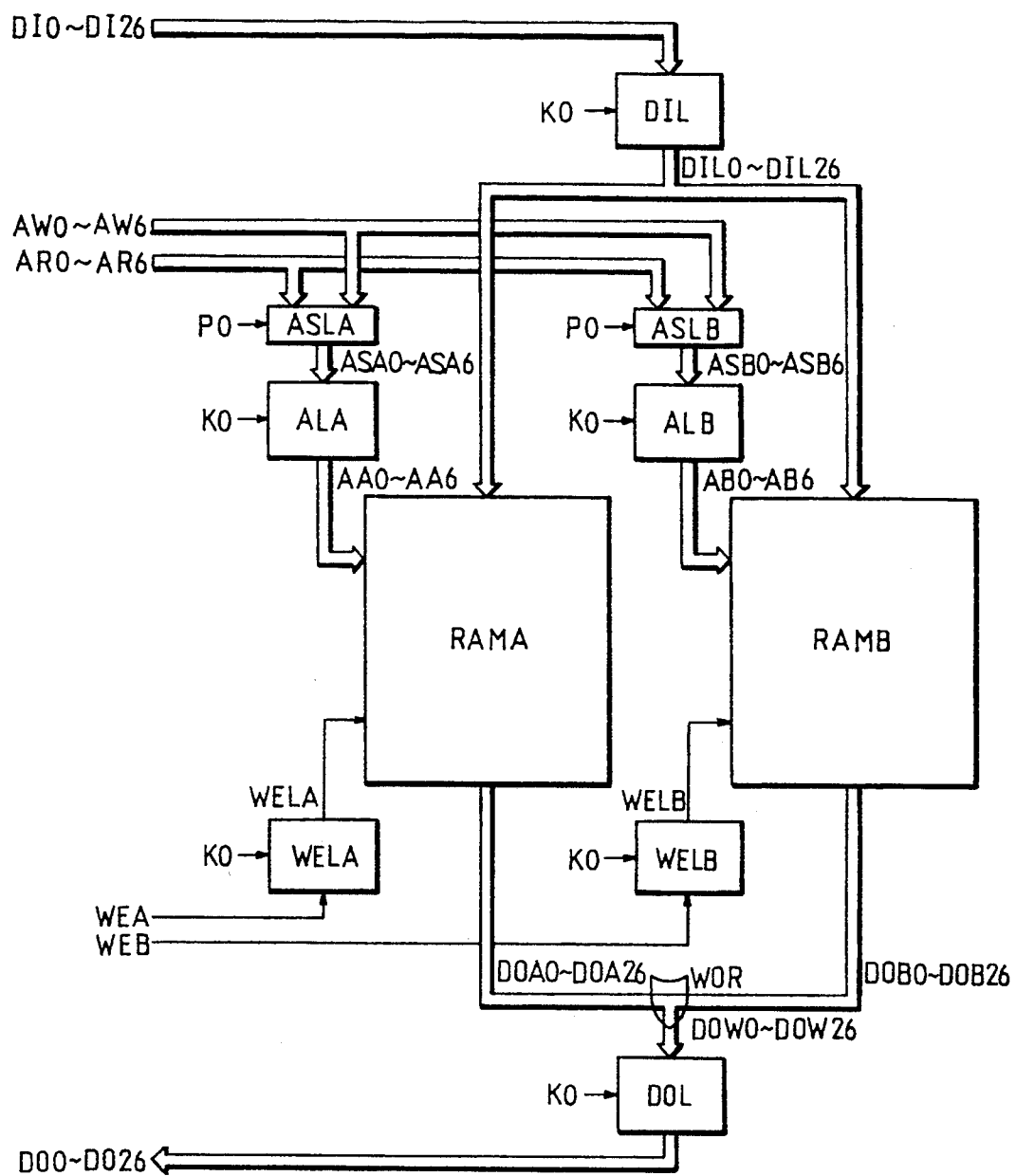
FIG. 9 is a block diagram showing a practicable embodiment of the memory with logic functions in FIG. 7.
Figure 10:
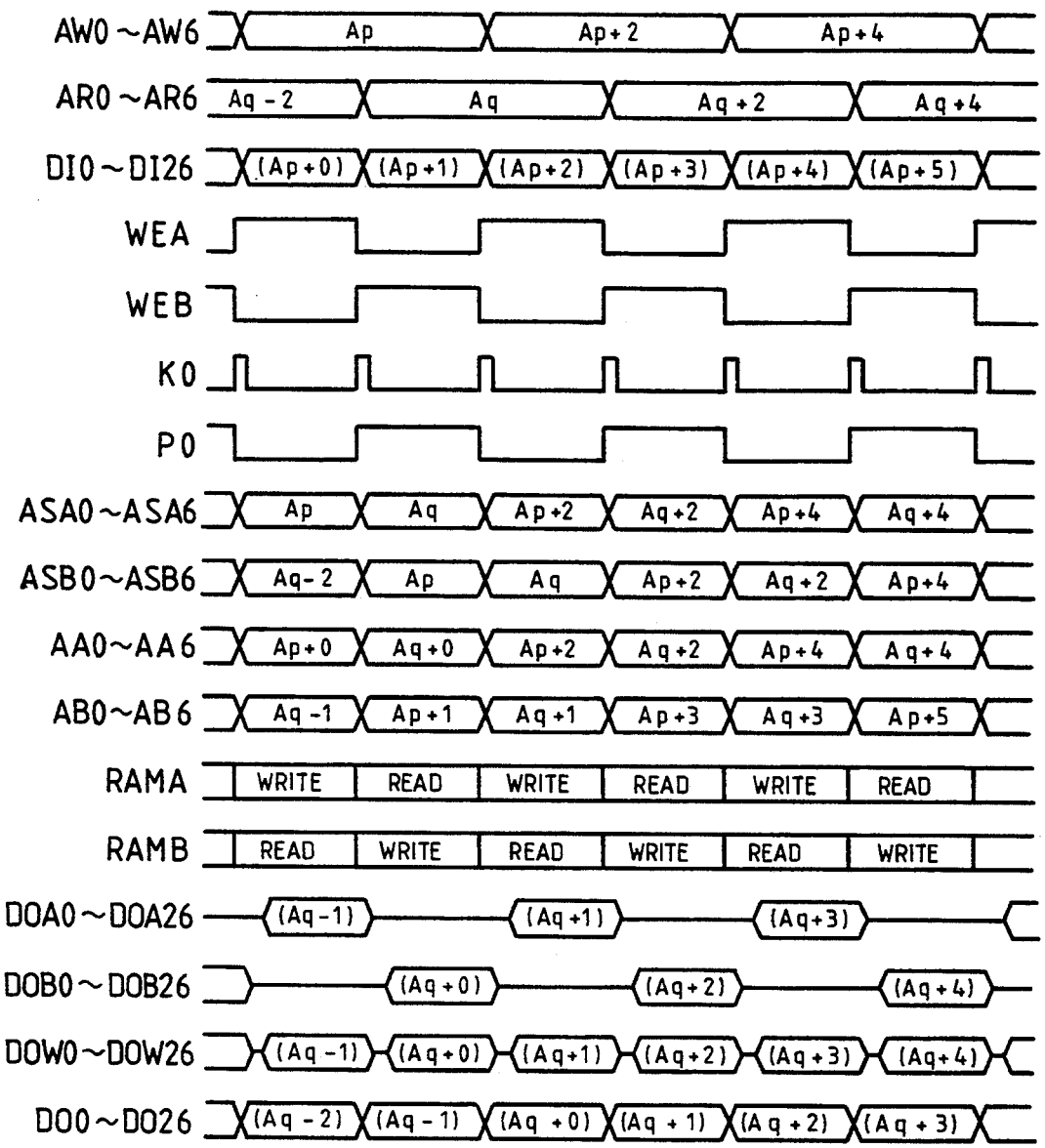
FIG. 10 is a timing chart showing an example of the operation of the memory with logic functions in FIG. 9.

FIG. 9 shows a block diagram of the practicable embodiment of the memory with logic functions in FIG. 7, namely, the memory with logic functions adopting the 2-bank mode, while FIG. 10 exemplifies a timing chart of the operation of the embodiment. The practicable example of the block arrangement of the the memory with logic functions adopting the 2-bank mode and the general operation of this memory will be described with reference to these figures.

Referring to FIG. 9, the memory with logic functions in this embodiment comprises two random access memories RAMA and RAMB formed on a common semiconductor substrate, though not especially restricted. The random access memories are both made up of bipolar type static RAMs, and they correspond respectively to the bank A and bank B of the memory with logic functions.

On the other hand, although no special restriction is meant, the number of bits i of each of the input data and output data of the memory with logic functions is set at:

$i=27$, that is, 3 bytes besides the parity bits of 3 bits, and the number of bits j of each of write address signals and read address signals is set at:

$j=7$.

Thus, each of the random access memories RAMA and RAMB is endowed with a storage capacity of 27 bits×128 words, namely, 3456 bits in total, and the whole memory with logic functions is endowed with a storage capacity of 27 bits×256 words, namely, 6912 bits in total.

In this embodiment, the read and write operations of the random access memories RAMA and RAMB are held in correspondence with the machine cycle of the high-speed computer as exemplified in FIG. 10. Besides, the random access memories RAMA and RAMB are simultaneously started in order that, when one of them is held in the read mode, the other may be held in the write mode, and they execute these operation modes in parallel. In the memory with logic functions in this embodiment, therefore, a write operation and a read operation for a series of addresses as required in, for example, the processing of vector operations, can be simultaneously and efficiently executed, and the substantial number of the address signal is curtailed one bit. As a result, the cycle time of the memory with logic functions is reduced to shorten the machine cycle of the high-speed computer and to enhance the processing capability thereof.

2-Bank Parallel Shift Access Mode

Figure 11:
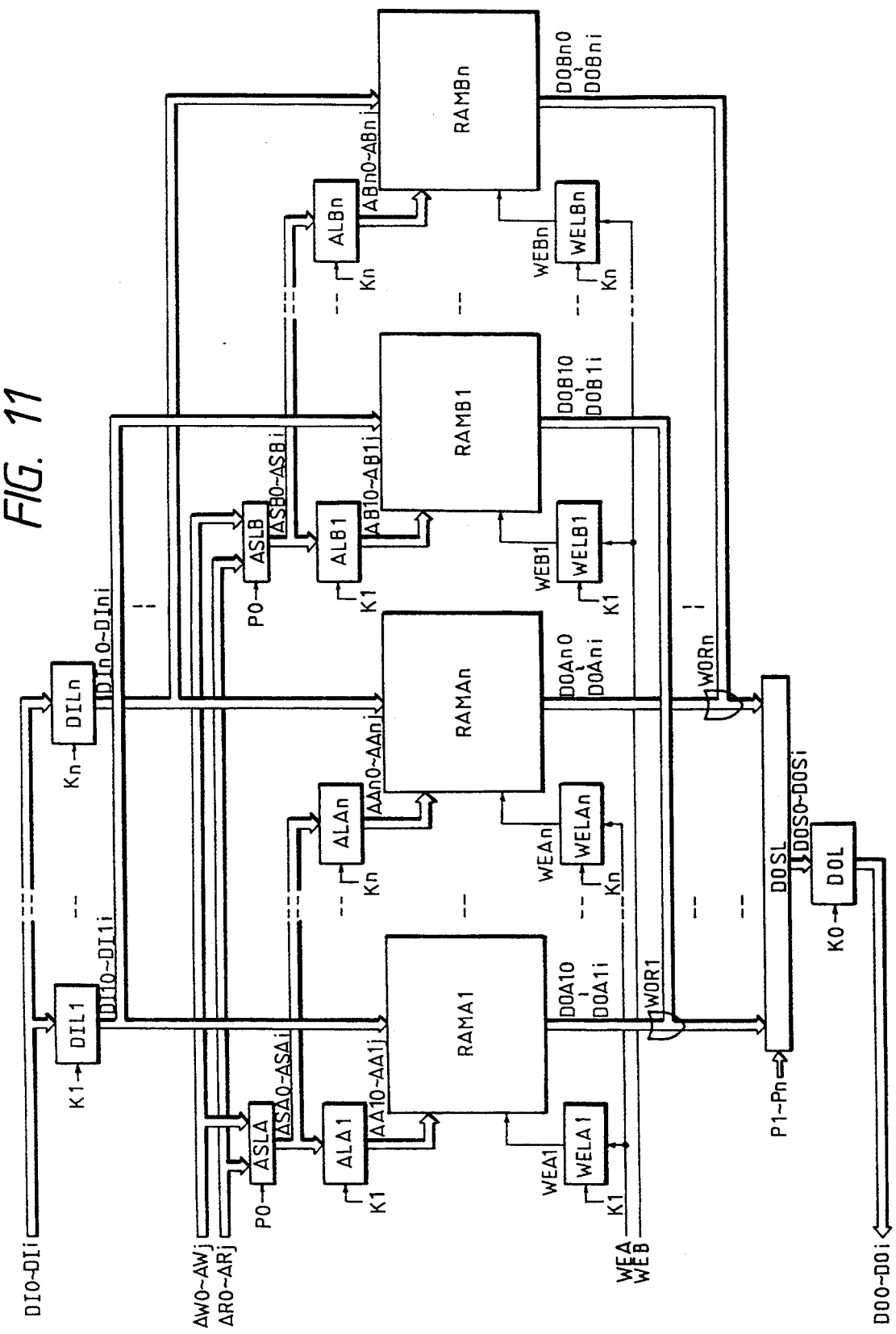
FIG. 11 is a fundamental conceptual diagram showing the third embodiment of a memory with logic functions to which this invention is applied.

FIG. 11 shows a fundamental conceptual diagram of the third embodiment of a memory with logic functions to which this invention is applied. In addition, FIG. 12 exemplifies a timing chart of the operation of the memory with logic functions in FIG. 11. The basic construction, general operation and features of the memory with logic functions in this embodiment will be described with reference to these figures. By the way, the memory with logic functions in this embodiment is basically constructed of the combination between the first embodiment, namely, the memory with logic functions in the parallel shift access mode and the second embodiment, namely, the memory with logic functions in the 2-bank mode. The memory with logic functions in this embodiment constitutes a high-speed memory device, such as vector register, included in a digital processor, such as high-speed computer, in the form of a single article or a plurality of articles combined, likewise to the first and second embodiments described above. Now, the description of portions differing from the memories with logic functions in the first and second embodiments will be supplemented.

Referring to FIG. 11, the memory with logic functions comprises n random access memories RAMA1-RAMAn constituting a bank A, and n other random access memories RAMB1-RAMBn constituting a bank B, though not especially restricted. Although no special restriction is intended, these random access memories are formed as macrocells on a common semiconductor substrate, and they are made up of bipolar type static RAMs each having a comparatively large storage capacity.

In this embodiment, the read operations of the random access memories RAMA1-RAMAn and RAMB1-RAMBn proceed at a comparatively high speed and are set so as to be capable of corresponding to the machine cycle of the high-speed computer. However, though no special restriction is intended, the cycle time of each random access memory in the write mode thereof requires a time period substantially equal to n machine cycles because this memory has a comparatively large storage capacity and expends a comparatively long time on the write mode. In other words, the number n of the random access memories constituting each of the banks A and B of the memory with logic functions in this embodiment is set in accordance with the number n of the machine cycles necessary for the write mode of each random access memory.

Meanwhile, in this embodiment, although no special restriction is meant, a series of consecutive address spaces are alternately and successively allocated to the n random access memories RAMA1-RAMAn and RAMB1-RAMBn constituting the respective banks A and B, so that the address spaces assigned to the individual random access memories do not overlap one another. Besides, one of the corresponding pairs of random access memories RAMA1 and RAMB1 thru RAMAn and RAMBn are alternately and simultaneously accessed in order that, when one of the two banks A and B is held in the read mode, the other may be held in the write mode. As a result, a write operation and a read operation for a series of different addresses as required in, for example, the processing of vector operations, can be simultaneously and efficiently executed at high speed in such a way that the banks A and B are alternately set at the read mode or the write mode while the random access memories RAMA1-RAMAn and RAMB1-RAMBn are being sequentially shifted and selected and while write address signals AW0-AWj and read address signals AR0-ARj are being independently counted up every n-th machine cycle.

Although no special restriction is meant, the memory with logic functions is fed with write address signals and read address signals of $(j+1)+1+\log_2 n$ bits which are sent through an unshown memory management unit from the internal bus of the high-speed computer. As stated before, these address signals are counted up independently of each other in correspondence with the processing of the high-speed computer. Among these address signals, the write address signals AW0-AWj and read address signals AR0-ARj of j+1 bits are supplied to the two banks A and B in common, while the address signals of the remaining $1+\log_2 n$ bits are decoded by the memory management unit. On the basis of the decoded signals, there are selectively formed internal clock signals K0-Kn for selectively designating the banks A and B and for alternatively bringing the random access memories RAMA1-RAMAn and RAMB1-RAMBn of the respective banks into operating states, pitch signals P0 and P1-Pn, and write enable signals WEA and WEB. The memory with logic functions is further supplied with input data items DI0-DIi of i+1 bits through the memory management unit. The read data items of the memory with logic functions are transmitted to the memory management unit as output data items DO0-DOi of i+1 bits, which are further sent to the internal bus of the high-speed computer.

Figure 12:
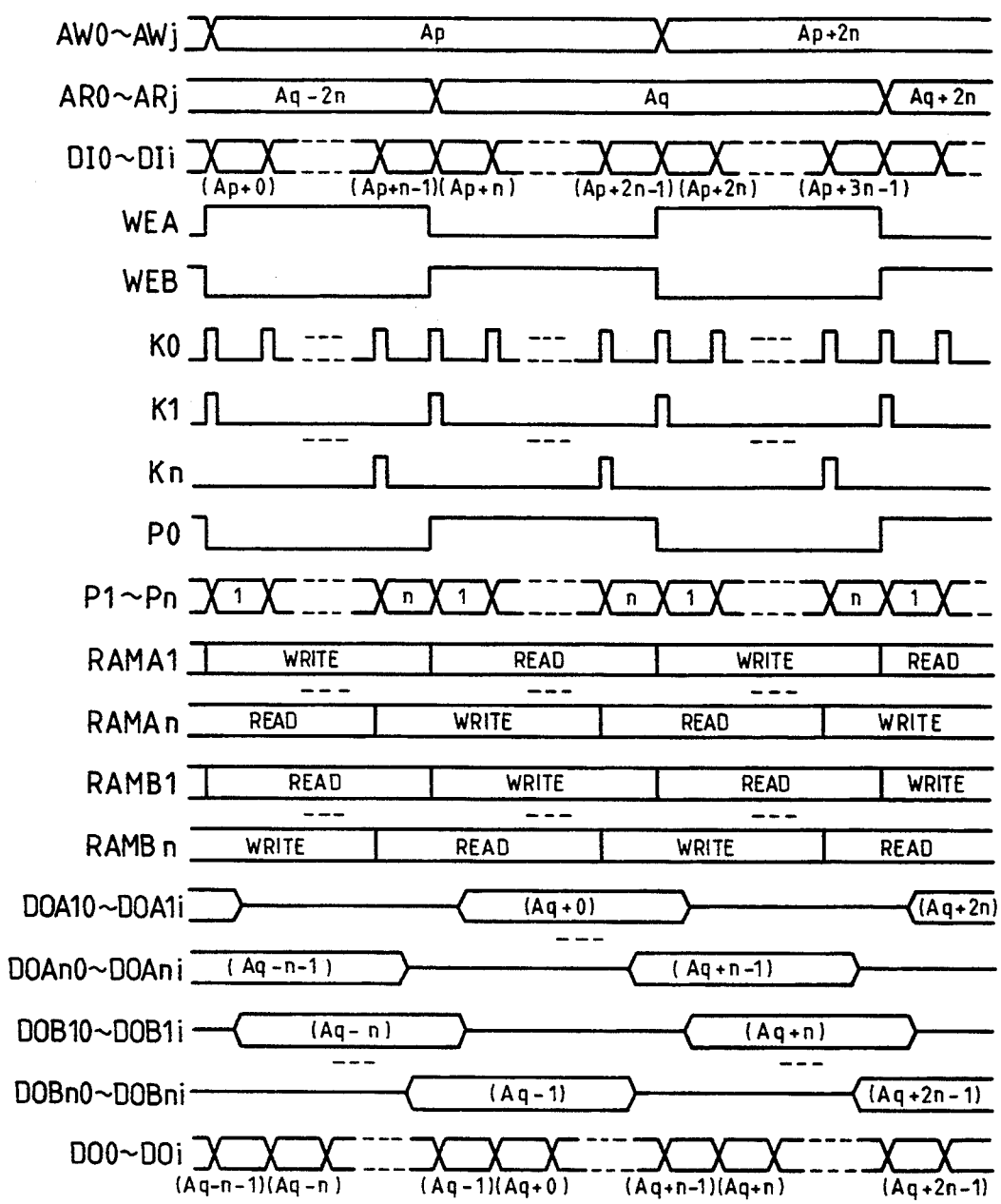
FIG. 12 is a timing chart showing an example of the operation of the memory with logic functions in FIG. 11.

Here, as exemplified in FIG. 12, the internal clock signal K0 is formed of a train of pulses synchronized with the machine cycles of the high-speed computer, while the internal clock signals K1-Kn are respectively formed of trains of pulses generated by dividing the frequency of the internal clock signal K0 into 1/n and sequentially shifting phases every machine cycle. Besides, although no special restriction is meant, the pitch signal P0 is changed in synchronism with the internal clock signal K0 and with n machine cycles as its period, and the pitch signals P1-Pn are changed with one machine cycle as their period and with delays of ½ machine cycle relative to the internal clock signal K0. Further, the write enable signals WEA and WEB are changed with n machine cycles with their period in order to alternatively bring the banks A and B into the read mode or the write mode, and they are selectively set at the high level when the corresponding banks are to be brought into the write mode. Moreover, as exemplified in FIG. 12, the write address signals AW0-AWj are changed with 2×n machine cycles as their period, while the read address signals AR0-ARj are changed at the middle points between the changing points of the write address signals and with 2×n machine cycles as their period.

Although no special restriction is meant, the write address signals AW0-AWj afforded as the inputs to the memory with logic functions are supplied in common to the input terminals on one side, of two address selector circuits ASLA and ASLB which are respectively disposed in correspondence with the banks A and B. In addition, the read address signals AR0-ARj are supplied in common to the input terminals on the other side, of the address selector circuits ASLA and ASLB. These address selector circuits are further supplied with the pitch signal P0. The output signal of the address selector circuit ASLA is supplied in common to n address latches ALA1-ALAn respectively disposed in correspondence with the random access memories RAMA1-RAMAn of the bank A, as internal address signals ASA0-ASAj. These address latches are further supplied with the corresponding internal clock signals K1-Kn, respectively. Likewise, the output signal of the address selector circuit ASLB is supplied in common to n address latches ALB1-ALBn respectively disposed in correspondence with the random access memories RAMB1-RAMBn of the bank B, as internal address signals ASB0-ASBj. These address latches are further supplied with the corresponding internal clock signals K1-Kn, respectively.

Although no special restriction is intended, the address selector circuit ASLA operates in such a manner that, when the pitch signal P0 is set at the low level, the write address signals AW0-AWj are selected and are supplied to the corresponding n address latches ALA1-ALAn as the internal address signals ASA0-ASAj. On the other hand, when the pitch signal P0 is set at the high level, the read address signals AR0-ARj are selected and are supplied to the address latches ALA1-ALAn as the internal address signals ASA0-ASAj. These internal address signals are sequentially accepted into the address latches ALA1-ALAn and are thereafter supplied to the corresponding random access memories RAMA1-RAMAn as internal address signals AA10–AA1j thru AAn0–AAnj in accordance with the internal clock signals K1–Kn, respectively.

Likewise, although no special restriction is intended, the address selector circuit ASLB operates in such a manner that, when the pitch signal P0 is set at the low level, the read address signals AR0–ARj are selected and are supplied to the corresponding n address latches ALB1–ALBn as the internal address signals ASB-0–ASBj. On the other hand, when the pitch signal P0 is set at the high level, the write address signals AW-0–AWj are selected and are supplied to the address latches ALB1–ALBn as the internal address signals ASB0–ASBj. These internal address signals are sequentially accepted into the address latches ALB1–ALBn and are thereafter supplied to the corresponding random access memories RAMB1–RAMBn as internal address signals AB10–AB1j thru ABn0–ABnj in accordance with the internal clock signals K1–Kn, respectively.

Meanwhile, the input data items DI0–DIi are supplied to n input data latches DIL1–DILn in common. These input data latches are further supplied with the corresponding internal clock signals K1–Kn, respectively. Thus, the input data items DI0–DIi are sequentially accepted into the input data latches DIL1–DILn in accordance with the internal clock signals K1–Kn, whereupon they are supplied in common to the corresponding pairs of random access memories RAMA1 and RAMB1 thru RAMAn and RAMBn of the banks A and B as internal input data items DI10–DI1i thru DIno–DIni, respectively.

Next, the write enable signal WEA is supplied to the n write enable signal latches WELA1–WELAn of the bank A in common though not especially restricted. These write enable signal latches are further supplied with the corresponding internal clock signals K1–Kn, respectively. Thus, the write enable signal WEA is sequentially accepted into the write enable signal latches WELA1–WELAn in accordance with the internal clock signals K1–Kn, whereupon it is supplied to the corresponding random access memories RAMA1–RAMAn as internal write enable signals WEA1–WEAn, respectively.

Likewise, the write enable signal WEB is supplied to the n write enable signal latches WELB1–WELBn of the bank B in common. These write enable signal latches are further supplied with the corresponding internal clock signals K1–Kn, respectively. Thus, the write enable signal WEB is sequentially accepted into the write enable signal latches WELB1–WELBn in accordance with the internal clock signals K1–Kn, whereupon it is supplied to the corresponding random access memories RAMB1–RAMBn as internal write enable signals WEB1–WEBn, respectively.

Owing to these operating aspects, the random access memories RAMA1–RAMAn constituting the bank A and those RAMB1–RAMBn constituting the bank B are accessed while each of the banks is being shifted every machine cycle, in order that the corresponding pair of random access memories of the banks A and B may be simultaneously accessed and that the banks A and B may be alternately brought into the read mode or the write mode. Herein, the write address signals AW-0–AWj or the read address signals AR0–ARj are selectively transmitted in correspondence with the operation mode of each bank. As stated before, the write address signals AW0–AWj and the read address signals AR-0–ARj are changed with $2 \times n$ machine cycles as their periods. However, substantial addresses designated by these write address signals and read address signals shift one by one with $2 \times n$ machine cycles as their periods as exemplified in FIG. 12 because the internal clock signals K1–Kn, write enable signals WEA and WEB and pitch signals P0 and P1–Pn are selectively formed in accordance with the other address signals of $1 + \log_{2n}$ bits.

The internal address signals AA10–AA1j thru AAn0–AAnj and AB10–AB1j thru ABn0–ABnj supplied to the random access memories RAMA1–RAMAn and RAMB1–RAMBn are decoded by the address decoders of the corresponding random access memories. As a result, the random access memories RAMA1–RAMAn and RAMB1–RAMBn are brought into substantial selected states so as to select $(i+1)$ memory cells corresponding to the designated addresses, respectively. On this occasion, when the corresponding internal write enable signals WELA1–WELAn or WELB1–WELBn are set at the low level, the individual random access memories read out the held data items of the selected memory cells, respectively. In contrast, when the corresponding internal write enable signals are set at the high level, the random access memories further form predetermined write pulses and then execute the operations of writing the internal input data items DI10–DI1i thru DIn0–DIni into the selected memory cells, respectively.

Although no special restriction is intended, the stored data items of $(i+1)$ bits read out of the designated addresses of one of the corresponding pairs of the random access memories RAMA1 and RAMB1 thru RAMAn and RAMBn of the banks A and B are respectively transmitted to corresponding wired OR circuits WOR-1–WORn as internal output data items DOA10–DOA1i and DOB10–DOB1i thru DOAn0–DOAni and DOBn0–DOBni, and they are further supplied to the corresponding input terminals of an output selector circuit DOSL. The output selector circuit DOSL is further supplied with the pitch signals P1–Pn. Incidentally, the read data items of the random access memories RAMA1–RAMAn and RAMB1–RAMBn have their levels established about $\frac{1}{2}$ machine cycle after the starts of the read operations.

The output selector circuit DOSL selects the internal output data items delivered through the wired OR circuits WOR1–WORn and transmits them to an output data latch DOL as internal output data items DOS-0–DOSi in accordance with the pitch signals P1–Pn. The output data latch DOL is further supplied with the internal clock signal K0.

The output data latch DOL accepts the internal output data items DOS0–DOSi in accordance with the internal clock signal K0, holds them for one machine cycle and sends them as the output data items DO0–DOi of the memory with logic functions. Consequently, the output data items DO0–DOi are sent from the memory with logic functions in a machine cycle next to the machine cycle in which the read operations have been performed.

As described above, the memory with logic functions in this embodiment comprises the two banks A and B which are formed on the common semiconductor substrate and which include the n random access memories RAMA1–RAMAn and RAMB1–RAMBn, respectively. The series of consecutive address spaces are alternately and successively allocated to these random access memories, and the address spaces assigned to the individual random access memories do not overlap one another. Besides, the random access memories are started so that the banks may be shifted every machine cycle, that the banks A and B may be alternately brought into the write or read mode, and that one of the corresponding pairs of random access memories RAMA1 and RAMB1 thru RAMAn and RAMBn may be simultaneously accessed, respectively, whereupon they are used for executing these operation modes in parallel. Thus, the memory with logic functions in this embodiment operates as a memory with logic functions in a so-called 2-bank parallel shift access mode which is the combination between the memory with logic functions in the first embodiment, namely, in the parallel shift access mode and the memory with logic functions in the second embodiment, namely, in the 2-bank mode. Therefore, the substantial cycle time of the memory with logic functions in each operation mode as viewed from the high-speed computer side becomes one machine cycle in any case in spite of the fact that the write operations of all the random access memories require n machine cycles. Further, the write operation and read operation for a series of different addresses as required in, for example, the processing of vector operations, can be simultaneously and efficiently executed at high speed in such a way that the banks A and B are alternately set at the read mode or write mode while write address signals and read address signals are being counted up independently of each other. On this occasion, the address signals to be afforded to the memory with logic functions are, in effect, curtailed $1+\log_2 n$ bits, and their address spaces are equivalently reduced. As a result, not only the substantial cycle time of the memory with logic functions is shortened, but also a time period for the decode processing of the address signals in each random access memory is shortened, and the cycle time of the memory with logic functions is more shortened to that extent. These facts result in shortening the machine cycle of the high-speed computer or the like and enhancing the processing capability thereof accordingly. Moreover, since each random access memory of the memory with logic functions has a comparatively large storage capacity, the bit width of the whole high-speed memory device and the number of addresses thereof are enlarged. In consequence, the operating performance of the high-speed computer or the like can be enhanced, and the overhead thereof is curtailed.

Figure 13:
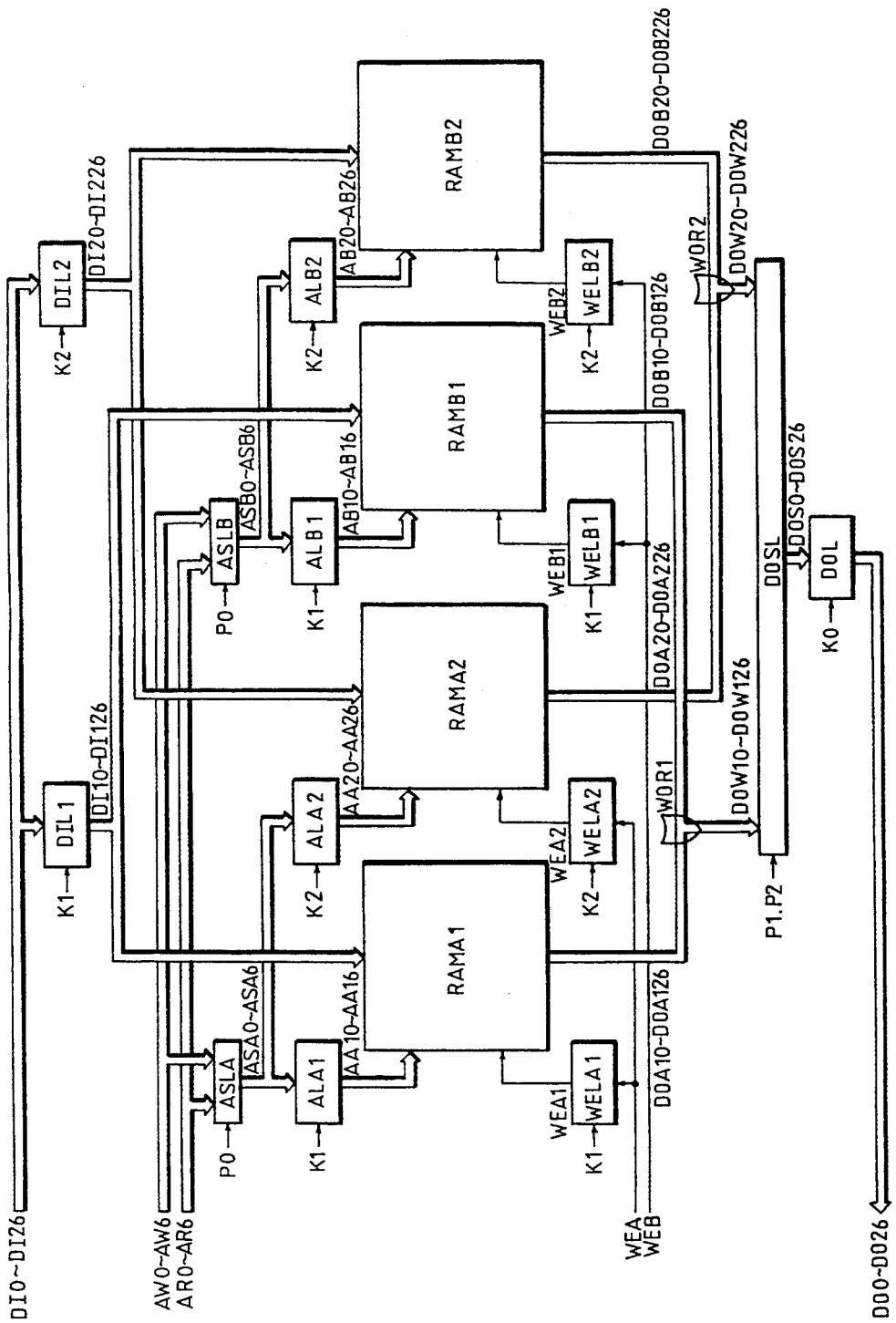
FIG. 13 is a block diagram showing the first practicable embodiment of the memory with logic functions in FIG. 11.
Figure 14:
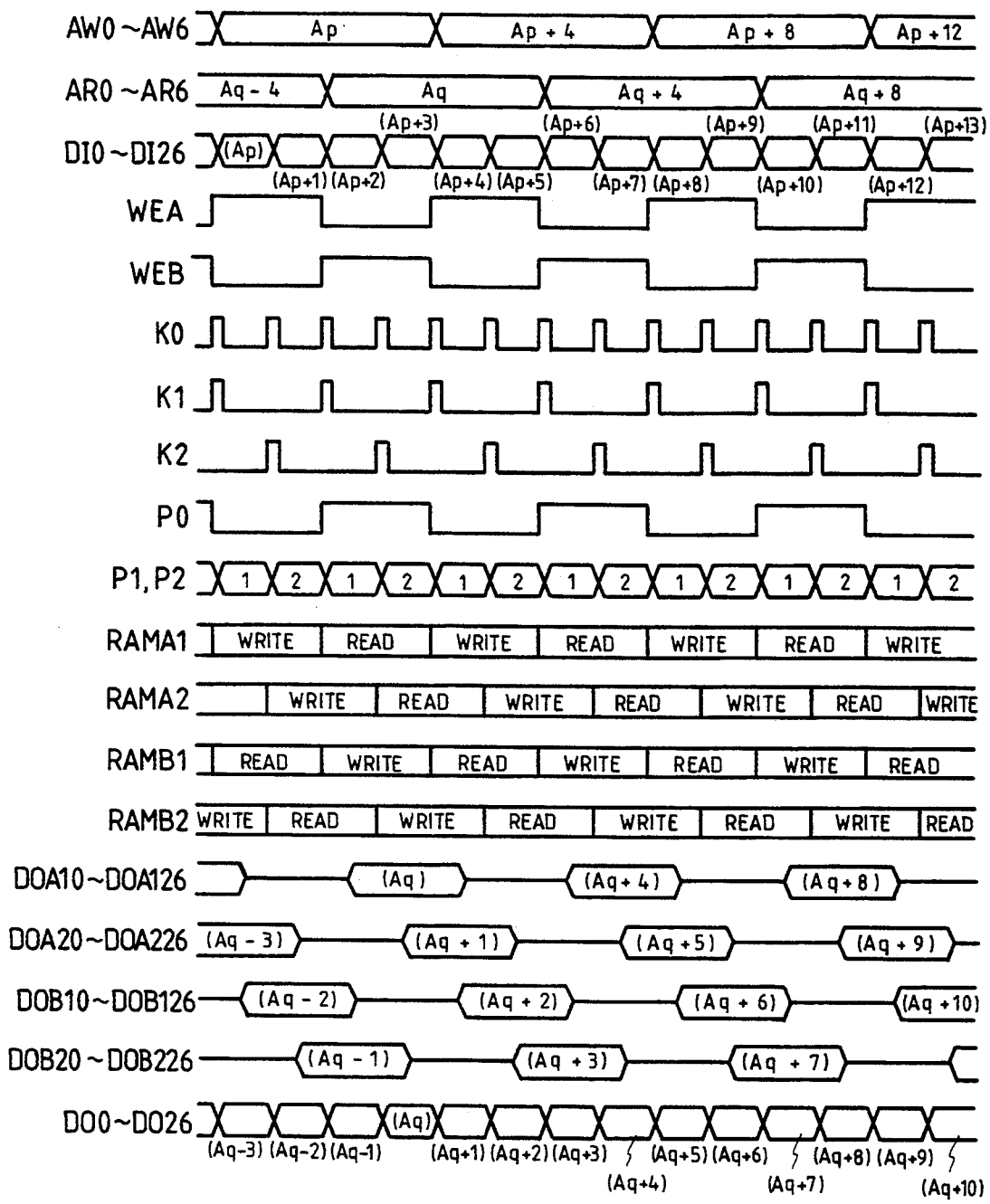
FIG. 14 is a timing chart showing an example of the operation of the memory with logic functions in FIG. 13.

FIG. 13 shows a block diagram of the first practicable embodiment of the memory with logic functions in FIG. 11, namely, the memory with logic functions adopting the 2-bank parallel shift access mode, while FIG. 14 exemplifies a timing chart of the operation of the embodiment. The practicable example of the block arrangement of the the memory with logic functions adopting the 2-bank parallel shift access mode and the general operation of this memory will be described with reference to these figures.

Referring to FIG. 13, the memory with logic functions in this embodiment comprises two random access memories RAMA1 and RAMA2 constituting a bank A, and two other random access memories RAMB1 and RAMB2 constituting a bank B. These random access memories are made up of two bipolar type static RAMs which are formed on a common semiconductor substrate. Thus, the number n of random access memories constituting each of the banks A and B is set at:

$n=2.$

On the other hand, the number of bits i of each of the input data and output data of the memory with logic functions is set at:

$i=27,$ that is, 3 bytes besides the parity bits of 3 bits, and the number of bits j of each of write address signals and read address signals is set at:

$j=7.$

As a result, each of the random access memories RAMA1 as well as RAMA2 and RAMB1 as well as RAMB2 is endowed with a storage capacity of 27 bits×128 words, namely, 3456 bits in total, and the whole memory with logic functions is endowed with a storage capacity of 27 bits×512 words, namely, 13824 bits in total.

In this embodiment, the read operations of the random access memories RAMA1 as well as RAMA2 and RAMB1 as well as RAMB2 are quickened so as to be capable of corresponding to the machine cycle of the high-speed computer as exemplified in FIG. 14, and the write operations thereof require a comparatively long time period equivalent to 4 machine cycles as also exemplified. In addition, the random access memories RAMA1 as well as RAMA2 and RAMB1 as well as RAMB2 are started so that the banks may be shifted every machine cycle, that when one of the banks is held in the read mode, the other may be held in the write mode, and that the corresponding pair of random access memories of the banks A and B may be simultaneously accessed, whereupon they are used for executing these operation modes in parallel. As a result, the substantial cycle time of the memory with logic functions in each operation mode as viewed from the high-speed computer side becomes one machine cycle in any case in spite of the fact that the write operations of all the random access memories require 2 machine cycles. Besides, a write operation and a read operation for a series of addresses as required in, for example, the processing of vector operations, can be simultaneously and efficiently executed at high speed because the banks A and B are simultaneously accessed in the write and read modes. This shortens the machine cycle of the high-speed computer and enhances the processing capability thereof accordingly.

Figure 15:
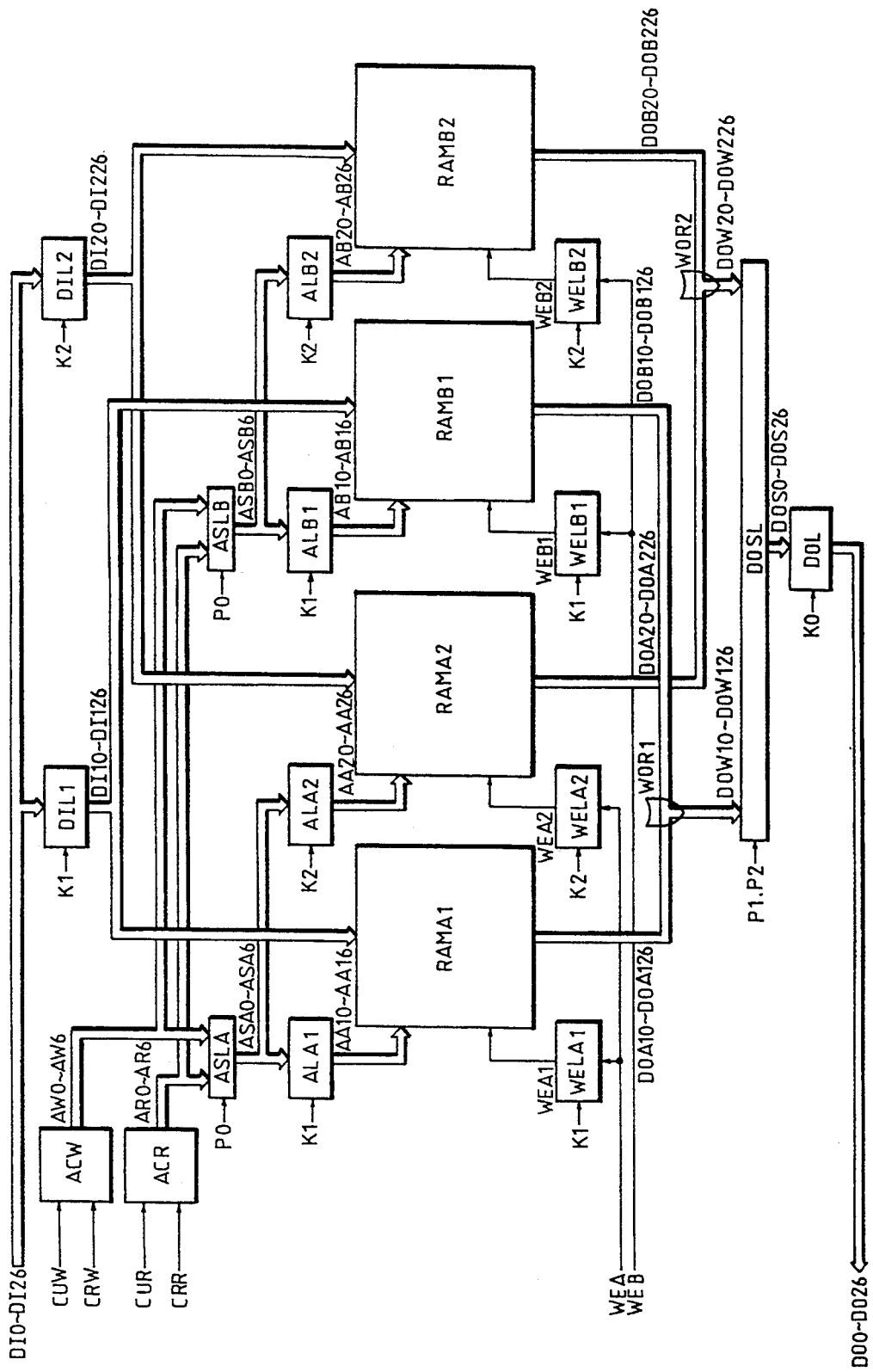
FIG. 15 is a block diagram showing the second practicable embodiment of the memory with logic functions in FIG. 11.
Figure 16:
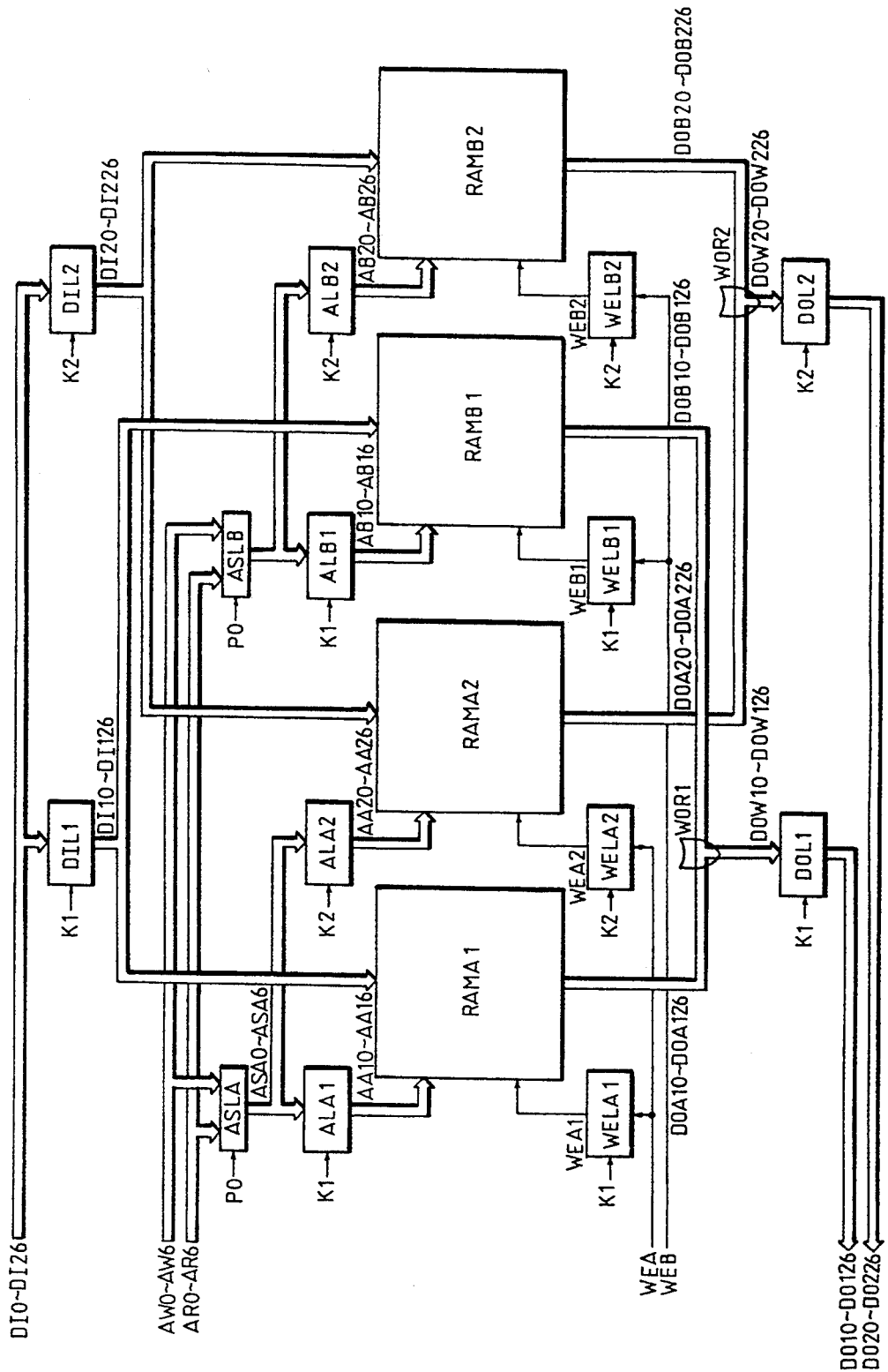
FIG. 16 is a block diagram showing the third practicable embodiment of the memory with logic functions in FIG. 11.
Figure 17:
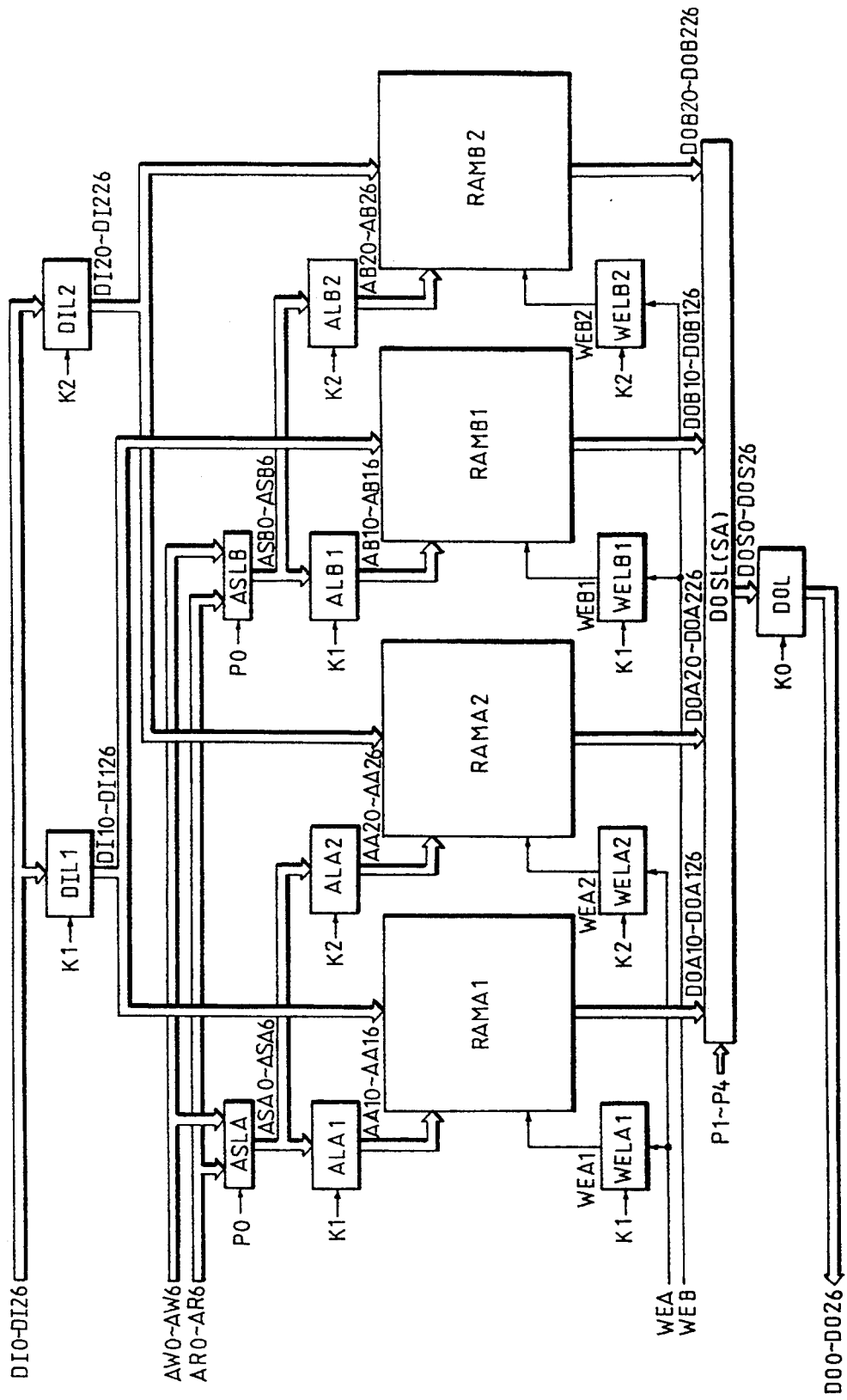
FIG. 17 is a block diagram showing the fourth practicable embodiment of the memory with logic functions in FIG. 11.

FIG. 15 shows a block diagram of the second practicable embodiment of the memory with logic functions in FIG. 11, namely, the memory with logic functions adopting the 2-bank parallel shift access mode, while FIGS. 16 and 17 show block diagrams of the third and fourth practicable embodiments. Since these embodiments fundamentally follow the memory with logic functions in FIG. 13, the description of only portions differing from them will be supplemented.

Referring to FIG. 15, the memory with logic functions includes a built-in write address counter ACW for forming write address signals AW0-AW6, and a built-in read address counter ACR for forming read address signals AR0-AR6. Each of these address counters is constructed of a binary counter circuit of 7 bits. Although not especially restricted, the write address counter ACW is supplied with a countup signal CUW and a counter reset signal CRW from a memory management unit not shown. Similarly, the read address counter ACR is supplied with a countup signal CUR and a counter reset signal CRR from the memory management unit.

The write address counter ACW performs an incremental operation in accordance with the countup signal CUW, and forms the write address signals AW0–AW6 of 7 bits. Besides, it resets its count value into a predetermined initial value in accordance with the counter reset signal CRW. The output signals of the write address counter ACW, namely, the write address signals AW-0–AW6 are supplied to the input terminals on one side, of address selector circuits ASLA and ASLB in common as stated before.

Likewise, the read address counter ACR performs an incremental operation in accordance with the countup signal CUR, and forms the read address signals AR-0–AR6 of 7 bits. Besides, it resets its count value into a predetermined initial value in accordance with the counter reset signal CRR. The output signals of the read address counter ACR, namely, the read address signals AR0–AR6 are supplied to the input terminals on the other side, of the address selector circuits ASLA and ASLB in common as stated before.

In this manner, the memory with logic functions in this embodiment includes the built-in write address counter ACW and read address counter ACR which are formed on the same semiconductor substrate as that of the random access memories RAMA1 as well as RAMA2 and RAMB1 as well as RAMB2. Therefore, it attains, besides the effects of the memory with logic functions in FIG. 13, the effects that the transfer delay times of the write and read address signals are shortened and that the skews of the signals are suppressed. As a result, the cycle time of the memory with logic functions is more shortened accordingly, and the machine cycle of the high-speed computer is reduced to that extent.

Next, the memory with logic functions in FIG. 16 is provided with output data latches DOL1 and DOL2 in correspondence with the two corresponding random access memories RAMA1 and RAMB1, and RAMA2 and RAMB2 of banks A and B. The output signals of the output data latches are sent to an unshown internal bus as the output data items DO10–DO126 and DO20–DO226 of the memory with logic functions. As a result, the output selector circuit DOSL in FIG. 13 is omitted, and the transfer delay time of the output data attributed to the selecting operation of this circuit is avoided. Thus, the cycle time of the memory with logic functions is more shortened, and an output form which can flexibly cope with the arithmetic processing method of the high-speed computer can be obtained.

Meanwhile, in the memory with logic functions in FIG. 17, the wired OR circuits WOR1 and WOR2 in FIG. 13 are omitted, and internal output data items DOA10–DOA126 as well as DOA20–DOA226 and DOB10–DOB126 as well as DOB20–DOB226, which are respectively delivered from random access memories RAMA1 as well as RAMA2 and RAMB1 and RAMB2, are directly transferred to an output selector circuit DOSL. The output selector circuit DOSL is supplied with pitch signals P1–P4, and the internal output data items delivered from the four random access memories are alternatively selected in accordance with these pitch signals. These internal output data items are further accepted into an output data latch DOL as internal output data items DOS0–DOS26 in accordance with an internal clock signal K0, whereupon they are sent as the output data items DO0–DO26 of the memory with logic functions in a machine cycle next to the machine cycle in which read operations have been executed.

In this embodiment, as will be stated later, the output selector circuit DOSL is basically constructed of a plurality of pairs of differential transistors which are disposed in correspondence with the respective bits of the internal output data and which are selectively brought into operating states in accordance with the pitch signals P1–P4, and it serves also as a sense amplifier SA for the read signals delivered from the individual random access memories. In other words, the sense amplifier for amplifying the read signals and the output selector circuit for selecting them are unitarily constructed, whereby the substantial number of logic stages in the output path of the memory with logic functions is curtailed. As a result, the cycle time of the memory with logic functions is more reduced, and the machine cycle of the high-speed computer is shortened accordingly.

The practicable circuit arrangements of the output selector circuit DOSL in FIG. 17 will be described in detail later.

Examples of Practicable Construction of Memory with Logic Functions

Substrate Layout

Figure 18:
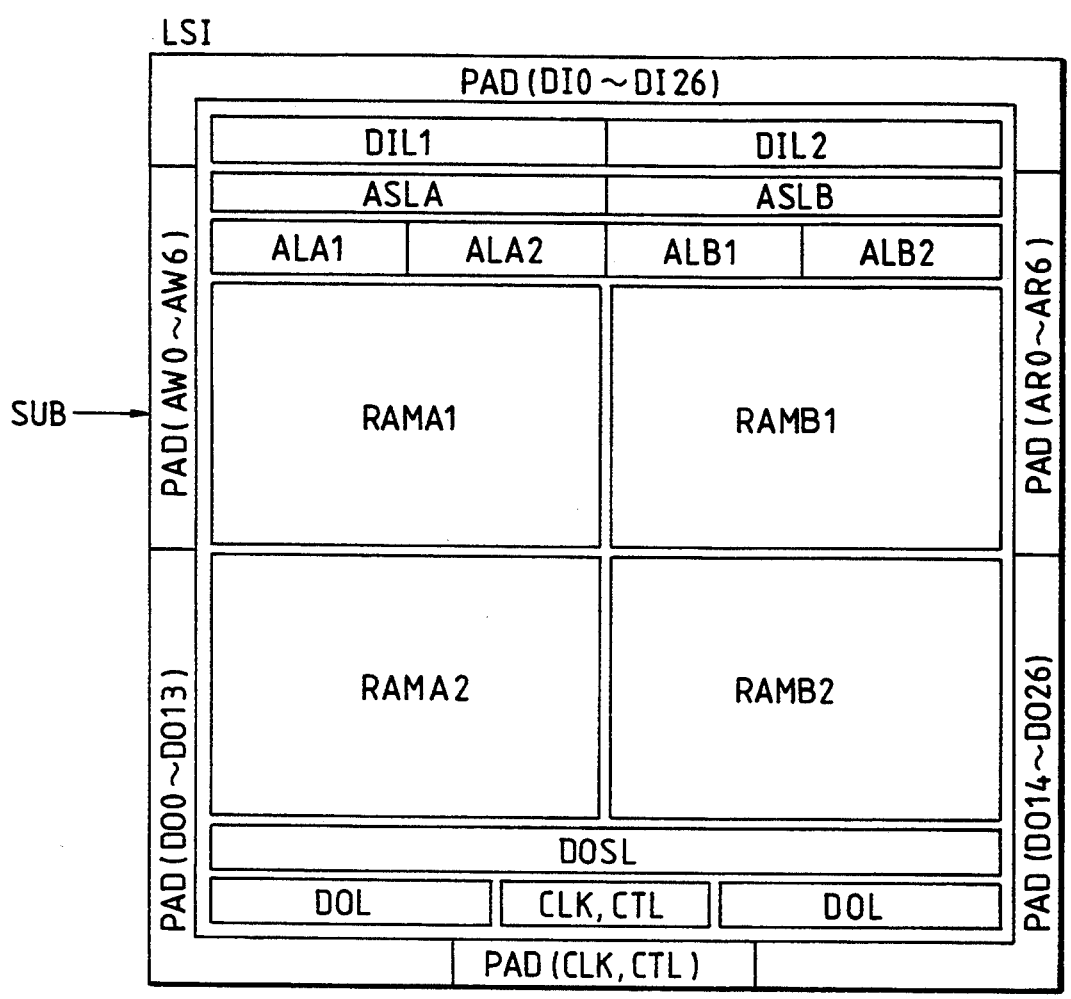
FIG. 18 is a substrate layout plan showing an embodiment of the memory with logic functions in FIG. 13.

FIG. 18 shows a substrate layout plan of a practicable embodiment of a memory with logic functions to which this invention is applied. The substrate layout and features of the memory with logic functions in this embodiment will be described with reference to the figure. By the way, the memory with logic functions in this embodiment corresponds to FIG. 13, in other words, the memory with logic functions adopting the 2-bank parallel shift access mode. In the ensuing description, the upper part and lower part of a semiconductor substrate SUB shall be assumed on the basis of positional relations in FIG. 18.

Referring to FIG. 18, four random access memories RAMA1 and RAMA2, and RAMB1 and RAMB2 respectively constituting the bank A, and bank B of the memory with logic functions are arranged in the shape of juxtaposed figure-8's at the central part of the semiconductor substrate SUB though no special restriction is meant. Although no special restriction is intended, corresponding address latches ALA1, ALA2 and ALB1, ALB2, address selector circuits ASLA and ASLB, and input data latches DIL1 and DIL2 are successively arranged above the random access memories, while an output selector circuit DOSL, output data latches DOL, and a control circuit CTL and a clock group circuit CLK which are common to the four random access memories are successively arranged below these memories. In addition, various bonding pads PAD which correspond to the input terminals and output terminals of the memory with logic functions are arranged in a predetermined order outside the random access memories and circuits mentioned above, that is, at the peripheral edge of the semiconductor substrate SUB.

Thus, in the memory with logic functions in this embodiment, the plurality of random access memories each having a comparatively large storage capacity are formed on the identical semiconductor substrate, and the direct peripheral circuits thereof are also formed on the identical semiconductor substrate. As a result, the transfer delay times of input/output signals among the individual random access memories or peripheral circuits of the memory with logic functions are remarkably reduced, and the cycle time of the memory with logic functions is shortened accordingly.

RAM Macrocell

Figure 19:
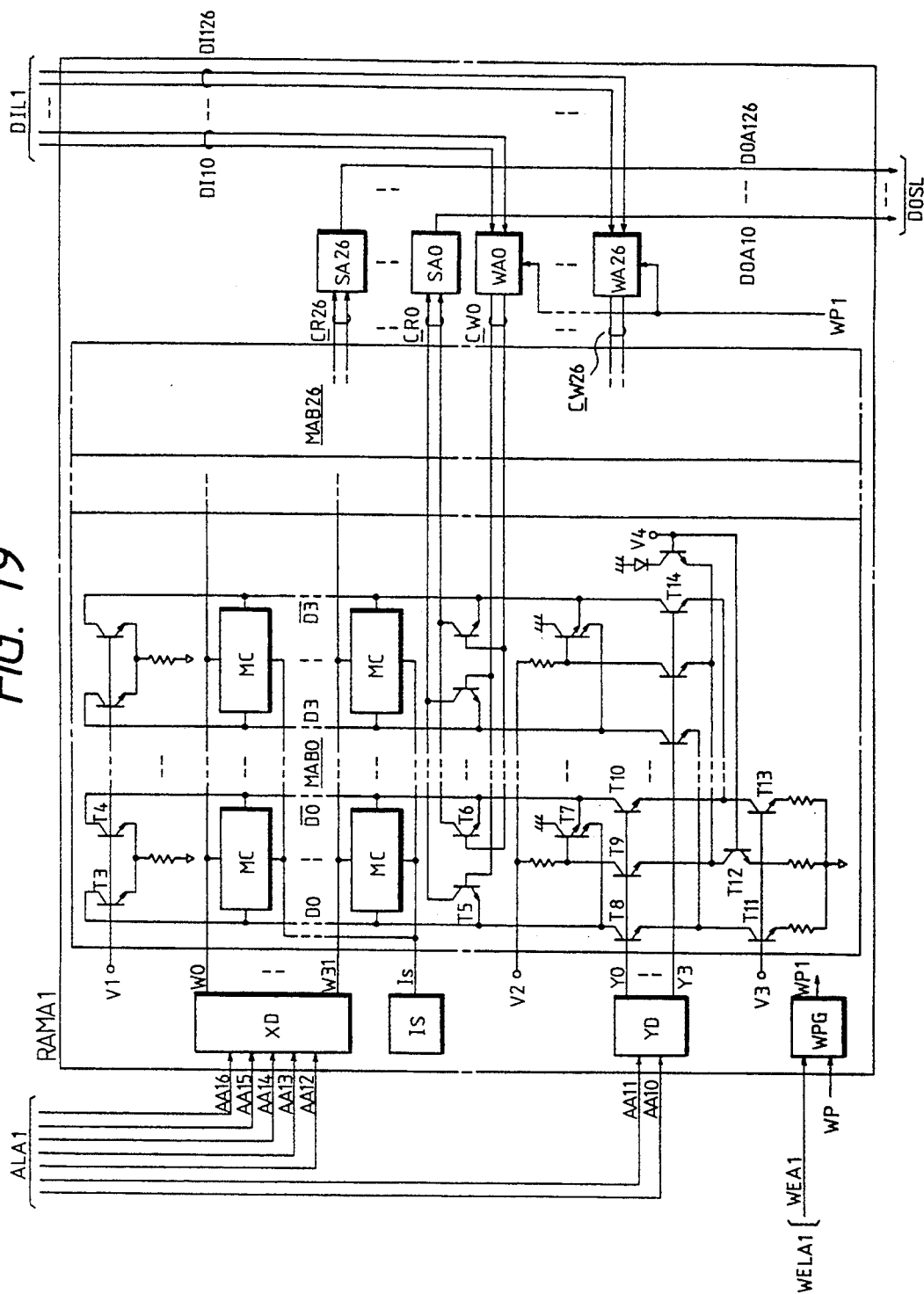
FIG. 19 is a circuit block diagram showing the first embodiment of a RAM macrocell which is included in the memory with logic functions in FIG. 13.
Figure 21:
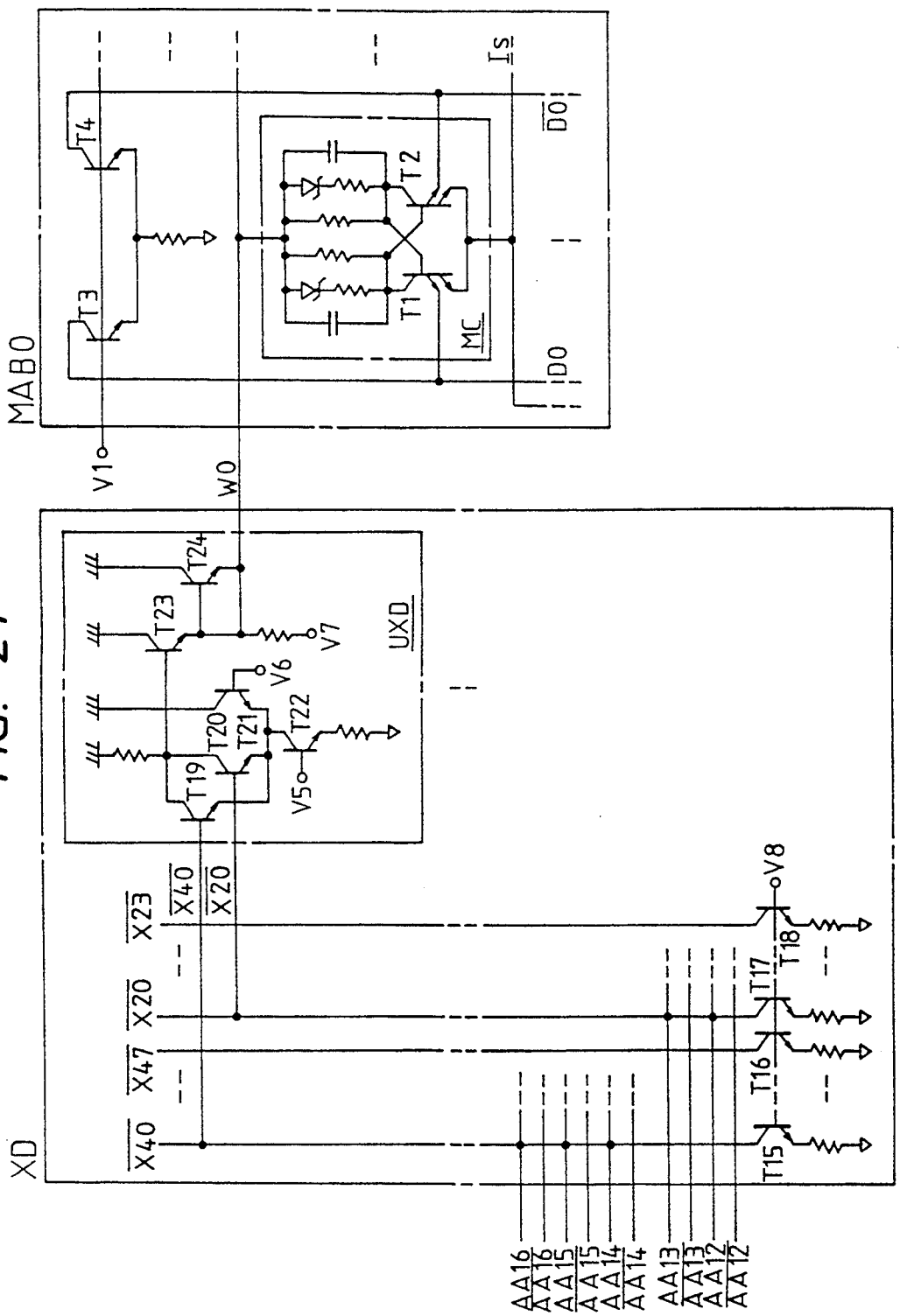
FIG. 21 is a circuit diagram showing an embodiment of a memory array block and an X address decoder which are included in the RAM macrocell in FIG. 19.

FIG. 19 shows a circuit block diagram of a practicable embodiment of the random access memory, namely, RAM macrocell of a memory with logic functions to which this invention is applied. Besides, FIG. 21 shows a circuit diagram of a practicable embodiment of a memory block as well as an X address decoder included in the RAM macrocell in FIG. 19. The practicable circuit arrangement and features of the memory with logic functions to which this invention is applied will be described with reference to these figures. By the way, the memory with logic functions in this embodiment corresponds to FIG. 13, in other words, the memory with logic functions adopting the 2-bank parallel shift access mode. In the ensuing description, the random access memory RAMA1 will be taken as an example. Accordingly, the other random access memories RAMA2 and RAMB1 as well as RAMB2 shall be inferred from the given description.

Referring to FIG. 19, though not especially restricted, the RAM macrocell (RAMA1) comprises 27 memory array blocks MAB0 –MAB26 which are disposed in correspondence with the respective bits of 27-bit input or output data items to be simultaneously received or delivered, and 27 write amplifiers WA0–WA26 and sense amplifiers SA0–SA26 which are disposed in correspondence with the memory array blocks. Also, though not especially restricted, the RAM macrocell comprises an X address decoder XD as well as a Y address decoder YD, a holding current supply circuit IS, and a write control circuit or write pulse generator WPG which are common to the 27 memory array blocks and the 27 write amplifiers and sense amplifiers.

Although no special restriction is intended, each of the memory array blocks MAB0–MAB26 includes 32 word lines W0–W31 horizontally laid in parallel, and 4 sets of complementary data lines D0–D3 vertically laid in parallel, as typically illustrated in the memory array block MAB0. (Here, a non-inverting data line D0 and an inverting data line $\overline{D0}$, for example, shall be expressed as the complementary data lines D0 in combination. Hereinbelow, the same shall hold true of complementary signals and complementary signal lines.) Memory cells MC numbering 32×4, i.e., totaling 128 are arranged in a matrix shape at the intersection points between the word lines and the complementary data lines. The memory cells MC are respectively held in correspondence with 128 address spaces which are allocated to the RAM macro-cell.

Although no special restriction is meant, each of the memory cells MC constituting the memory array block is as exemplified in FIG. 21, and it is basically constructed of a flip-flop circuit which includes a pair of N-P-N type drive transistors T1 and T2 having their bases and collectors cross-coupled to each other, and load means respectively disposed on the collector sides of these drive transistors. Although not especially restricted, each of the drive transistors T1 and T2 has a multiemitter structure furnished with two emitters. One emitter of one drive transistor and that of the other drive transistor are coupled in common, and the common node is further coupled to the holding current supply circuit IS through a holding current supply line Is. Besides, the other emitters of both the drive transistors are used as the input/output nodes of the memory cell MC and are respectively coupled in common to the corresponding ones (e.g., D0 and $\overline{D0}$) of the non-inverting signal lines D0–D3 and inverting signal lines $\overline{D0}$–$\overline{D3}$ of the complementary data lines. The collectors of the drive transistors T1 and T2 are both coupled in common to the corresponding one (e.g., W0) of the word lines W0–W31 through the pair of load means.

Although not especially restricted, the holding current supply circuit IS has the function of causing a predetermined storage holding current necessary for the storage holding operation of the memory cell MC to flow on the basis of a predetermined reference potential not shown. Since the storage holding current is kept flowing steadily even under the non-selected state of the RAM macrocell, the value thereof is set at such a very small value that the memory cell MC can hold stored data.

The individual word lines W0–W31 constituting the memory array blocks MAB0–MAB26 are coupled in common in a manner to penetrate these memory array blocks and are further coupled to the X address decoder XD, and they are alternatively brought into selected states.

Although not especially restricted, the X address decoder XD is as illustrated in FIG. 21, and it includes terminating circuits totaling 12, which receive the non-inverted or inverted signals of 2-bit internal address signals AA12 and AA13 and the non-inverted or inverted signals of 3-bit internal address signals AA14–AA16 in predetermined combinations, and 32 unit decoder circuits UXD which are disposed in correspondence with the word lines W0–W31 of the memory array blocks MAB0–MAB26.

Each of the terminating circuits among the above circuits functions, in effect, as a 2-input or 3-input AND gate circuit of negative logic. It brings the corresponding one of inverted predecode signals $\overline{X20}$–$\overline{X23}$ or $\overline{X40}$–$\overline{X47}$ to the low level alternatively when the corresponding ones of the non-inverted or inverted signals of the 2-bit or 3-bit internal address signals are simultaneously set at the low level in the predetermined combination.

On the other hand, although not especially restricted, each of the unit decoder circuits UXD is as exemplified in FIG. 21 and is basically constructed of two input transistors T19 and T20 connected in parallel and a transistor T21 connected in a differential form with respect to these input transistors. The bases of the input transistors T19 and T20 are respectively supplied with one of the inverted predecode signals $\overline{X20}$–$\overline{X23}$ and one of the inverted predecode signals $\overline{X40}$–$\overline{X47}$ in the predetermined combination, and the base of the transistor T21 is supplied with a predetermined reference potential V6. Thus, the transistors T19–T21 construct a current switch circuit whose logic threshold is the reference potential V6, together with a transistor T22 functioning as a regulated current source. Although no special restriction is intended, the inverted output signal of the current switch circuit, that is, the potential of the collectors of the input transistors T19 and T20 coupled in common is turned into the output signal of the X address decoder XD via two Darlington-coupled output transistors T23 and T24, and the output signal is transmitted to the corresponding one of the word lines W0–W31 of the memory array blocks MAB0–MAB26. In consequence, these word lines are selectively brought into the selected states of high level when the inverted predecode signals $\overline{X20}$–$\overline{X23}$ and $\overline{X40}$–$\overline{X47}$ are simultaneously set at the low level in the predetermined combinations, in other words, when the non-inverted and inverted signals of the internal address signals AA12–AA17 are simultaneously set at the low level in the predetermined combinations.

Next, the complementary data lines $\underline{D0}$–$\underline{D3}$ constituting the memory array blocks MAB0–$\overline{\text{MAB}}$26 are coupled in common to the collectors of transistors T11 and T13 via corresponding pairs of column selecting transistors T8 and T10, as typically illustrated in the memory array block MAB0 in FIG. 19. The transistors T11 and T13 function as regulated current sources for write and read operations in such a way that the bases thereof are supplied with a predetermined constant voltage V3, while the emitters thereof are coupled to the power source voltage of the circuitry through corresponding emitter resistances. Incidentally, the power source voltage of the circuitry is set at a minus power source voltage such as −5.2 V though not especially restricted. The bases of the respective pairs of column selecting transistors T8 and T10 are supplied with corresponding ones of data line selecting signals Y0–Y3 from the Y address decoder YD.

Although not especially restricted, the Y address decoder YD has a circuit arrangement similar to that of the X address decoder XD and includes four unit decoder circuits disposed in correspondence with the complementary data lines $\underline{D0}$–$\underline{D3}$ of the memory array blocks MAB0–MAB26. Herein, when the non-inverted or inverted signals of the internal address signals AA10–AA11 of the remaining bits are simultaneously set at the low level in the predetermined combinations, the Y address decoder YD brings the corresponding ones of the data line selecting signals Y0–Y3 to the high level alternatively. As a result, the corresponding pairs of column selecting transistors T8 and T10 of the individual memory array blocks are selectively brought into "on" states, and the corresponding complementary data lines $\underline{D0}$–$\underline{D3}$ are alternatively brought into selected states.

Meanwhile, though not especially restricted, each of the memory array blocks MAB0–MAB26 comprises a bias circuit to be stated below, for applying a predetermined bias voltage to the complementary data lines $\underline{D0}$–$\underline{D3}$.

On one side thereof, the complementary data lines $\underline{D0}$–$\underline{D3}$ are coupled to the power source voltage of the circuitry through corresponding transistors T3 and T4 and their emitter resistance. The bases of the transistors T3 and T4 are all coupled in common and supplied with a predetermined constant voltage V1. Thus, the respective sets each consisting of the transistors T3 and T4 and their emitter resistance function as regulated current sources, which cause minute absorption currents to flow through the corresponding complementary data lines $\underline{D0}$–$\underline{D3}$ at all times.

On the other side thereof, the complementary data lines $\underline{D0}$–$\underline{D3}$ are respectively coupled to the first and second emitters of corresponding transistors T7 of the multiemitter type though not especially restricted. The collectors of the transistors T7 are coupled to the ground potential of the circuitry. In addition, the bases of the transistors T7 are coupled through resistances to a point V2 for feeding a predetermined constant voltage, and they are coupled in common to the collector of a transistor T12 through other column selecting transistors T9 each of which is coupled in parallel with the corresponding pair of column selecting transistors T8 and T10. The bases of the column selecting transistors T9 are respectively supplied with corresponding ones of the data line selecting signals Y0–Y3. Besides, the emitters of the column selecting transistors T9 coupled in common are further coupled in common to the emitter of a transistor T14 held in a differential form. The base of the transistor T14 is supplied with a predetermined constant voltage V4. Thus, the four column selecting transistors T9 which correspond to the transistor T14 construct a current switch circuit whose logic threshold is the voltage V4. The transistor T12 functions as a regulated current source in such a way that the emitter thereof is coupled to the power source voltage of the circuitry through a resistance, while the base thereof is supplied with the constant voltage V4.

When all the data line selecting signals Y0–Y3 are set at the low level and the complementary data lines $\underline{D0}$–$\underline{D3}$ are brought into the non-selected states, the corresponding transistors T9 fall into "off" states. Consequently, all the transistors T7 fall into "on" states, and the potentials of the non-inverting and inverting signal lines of the complementary data lines $\underline{D0}$–$\underline{D3}$ are biased to a voltage which is obtained by subtracting the base-emitter voltage of the transistors T7 from the constant voltage V2.

In contrast, when the data line selecting signals Y0–Y3 are alternatively set at the high level and the corresponding complementary data lines $\underline{D0}$–$\underline{D3}$ are brought into the selected states, the corresponding transistors T9 fall into "on" states alternatively. Consequently, the corresponding transistors T7 fall into "off" states alternatively, and the levels of one corresponding set of complementary data lines are set at potentials conforming to the stored information of a selected memory cell. On this occasion, the corresponding pair of column selecting transistors T8 and T10 are simultaneously turned "on", so that comparatively great currents are caused to flow to the selected set of complementary data lines via the corresponding pair of transistors T11 and T13. Moreover, the four memory cells MC coupled in common to one of the word lines W0–W31 are supplied with a comparatively great operating current because the corresponding word line is set at the high level alternatively. Therefore, the levels of the non-inverting signal line and inverting signal line of the selected complementary data lines has their difference enlarged while both are rising.

In the RAM macrocell of this embodiment, the respective complementary data lines $\underline{D0}$–$\underline{D3}$ constituting the memory array blocks MAB0–$\overline{\text{MAB}}$26 are further coupled to the emitters of corresponding ones of sensing transistors T5 and T6 as exemplified in FIG. 19, though not especially restricted. The collectors of these sensing transistors are coupled in common to the non-inverting or inverting signal lines of corresponding ones of complementary read signal lines $\overline{\text{CR0}}$–$\overline{\text{CR26}}$, and are further coupled to the input terminals of corresponding ones of the sense amplifiers SA0–SA26. Besides, the bases of the sensing transistors are coupled in common to the non-inverting or inverting signal lines of corresponding ones of complementary write signals lines $\underline{\text{CW0}}$–$\underline{\text{CW26}}$, and they are further coupled to the output terminals of corresponding ones of the write amplifiers WA0–WA26.

Here, when the RAM macrocell is in the read mode, the levels of the complementary write signal lines $\overline{CW0}$–$\overline{CW26}$ are set so as to become substantially the middle potential between the levels of the read signals of the complementary data lines, and the potential is used as a reference potential in the read operation. On this occasion, the sensing transistors T5 and T6 are coupled in differential forms with respect to the drive transistors T1 and T2 of the selected memory cell MC, and read currents conforming to the stored data of the memory cell MC are afforded to any of the sense amplifiers SA0–SA26 through the corresponding complementary read signal lines $\overline{CR0}$–$\overline{CR26}$.

On the other hand, when the $\overline{RAM}$ macrocell is in the write mode, the sensing transistors T5 and T6 are similarly coupled in the differential forms with respect to the drive transistors T1 and T2 of the corresponding memory cell MC. On this occasion, however, the complementary write signal lines $\overline{CW0}$–$\overline{CW26}$ are complementarily set at write levels higher than the high level of the held voltage of the selected memory cell and lower than the low level thereof, in accordance with any of internal input data items DI10–DI126 which are supplied from the corresponding input data latch DIL1. Therefore, the drive transistors T1 and T2 of the selected memory cell are complementarily brought into "on" and "off" states in response to the write levels of the corresponding complementary write signal lines. As a result, the stored data items of the respective memory cells MC are rewritten in accordance with the corresponding internal input data items DI10–DI126.

Although no special restriction is meant, the write amplifiers WA0–WA26 are selectively brought into operating states in accordance with a write pulse WP1 which is supplied from the write control circuit or write pulse generator WPG. In the operating states, the write amplifiers WA0–WA26 form predetermined complementary write signals in accordance with the corresponding internal input data items DI10–DI126 and deliver them to the corresponding complementary write signal lines $\overline{CW0}$–$\overline{CW26}$. When the write pulse WP1 is set at the low level, the write amplifiers WA0–WA26 set the levels of the corresponding complementary write signal lines $\overline{CW0}$–$\overline{CW26}$ at the predetermined middle level serving as the reference potential of the read operation.

When the RAM macrocell is in the read mode, the sense amplifiers SA0–SA26 amplify read signals transmitted through the corresponding complementary read signal lines $\overline{CR0}$–$\overline{CR26}$ from the memory cells MC which are such that one memory cell is selected from each of the memory array blocks MAB0–MAB26. The output signals of the sense amplifiers SA0–SA26 are transferred to the output selector circuit DOSL as internal output data items DOA10–DOA126.

Although no special restriction is meant, the write control circuit WPG forms the write pulse WP1 on the basis of an internal write enable signal WEA1 supplied from a corresponding write enable signal latch WELA1 and a write pulse WP supplied from a memory management unit not shown and supplies it to the write amplifiers WA0–WA26.

Sense Amplifier With Output Selecting Function

Figure 22:
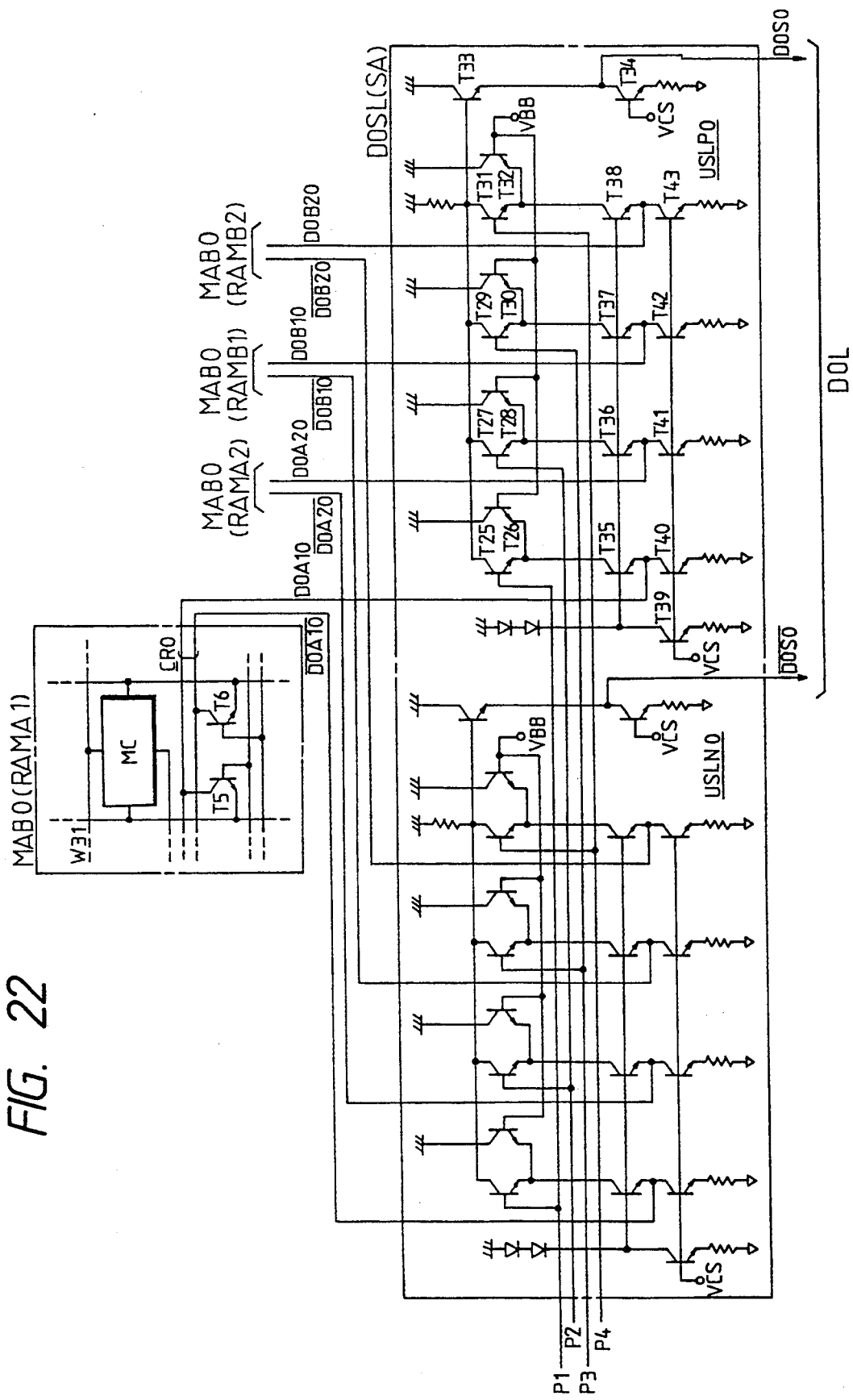
FIG. 22 is a circuit diagram showing the first embodiment of an output selector circuit (a sense amplifier having an output selecting function) which is included in the memory with logic functions in FIG. 17.
Figure 23:
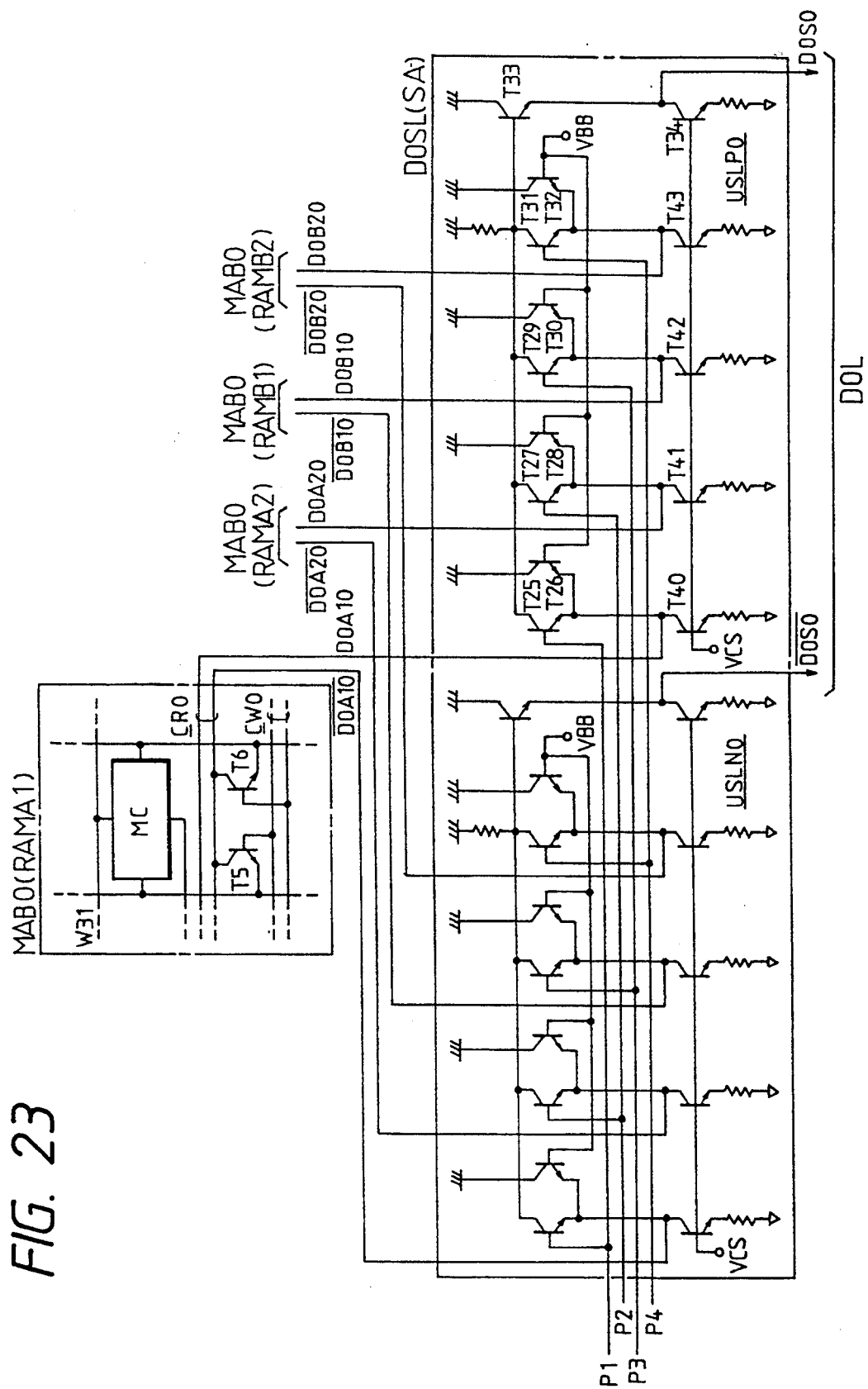
FIG. 23 is a circuit diagram showing the second embodiment of the output selector circuit (the sense amplifier having the output selecting function) which is included in the memory with logic functions in FIG. 17.
Figure 24:
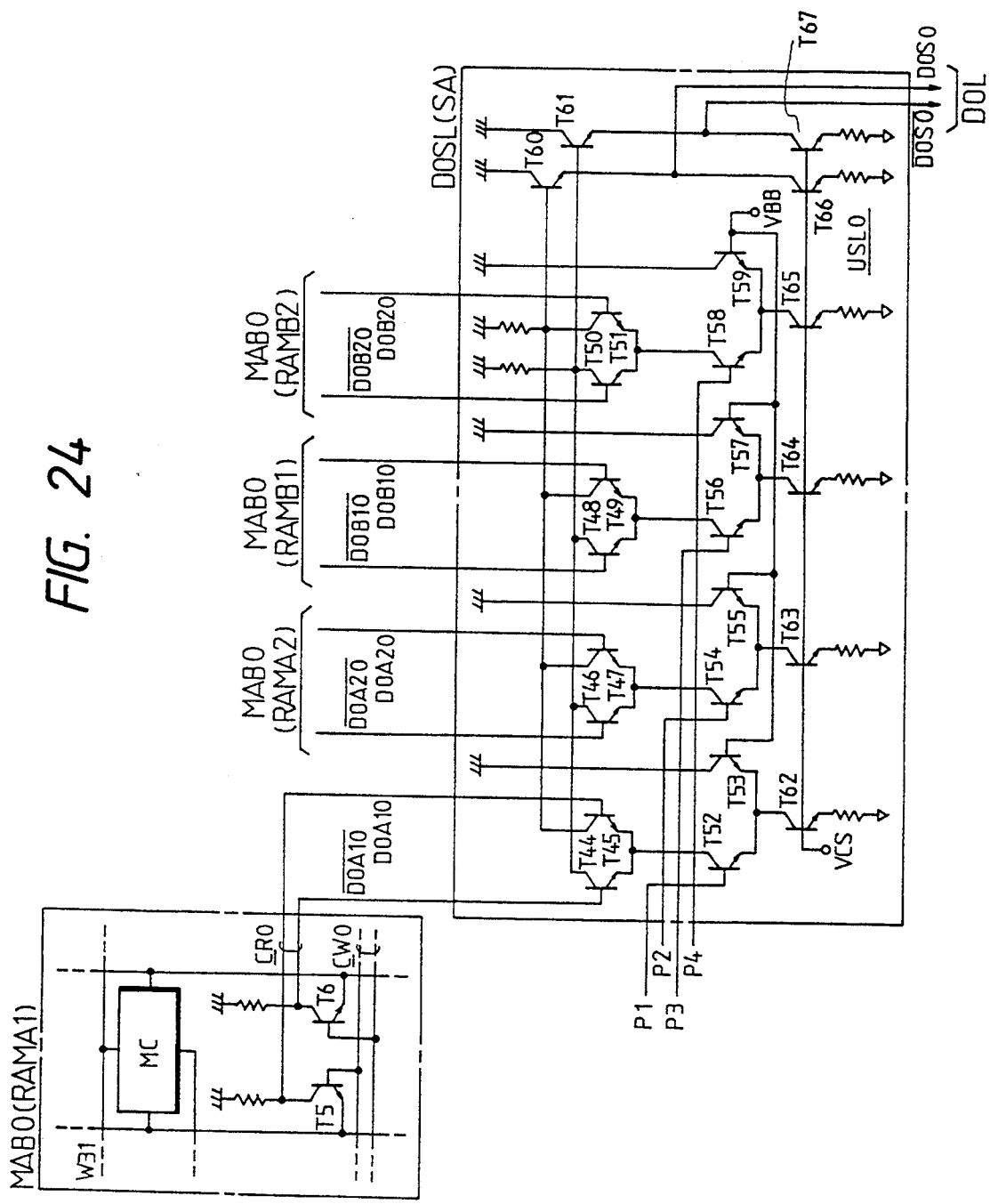
FIG. 24 is a circuit diagram showing the third embodiment of the output selector circuit (the sense amplifier having the output selecting function) which is included in the memory with logic functions in FIG. 17.
Figure 25:
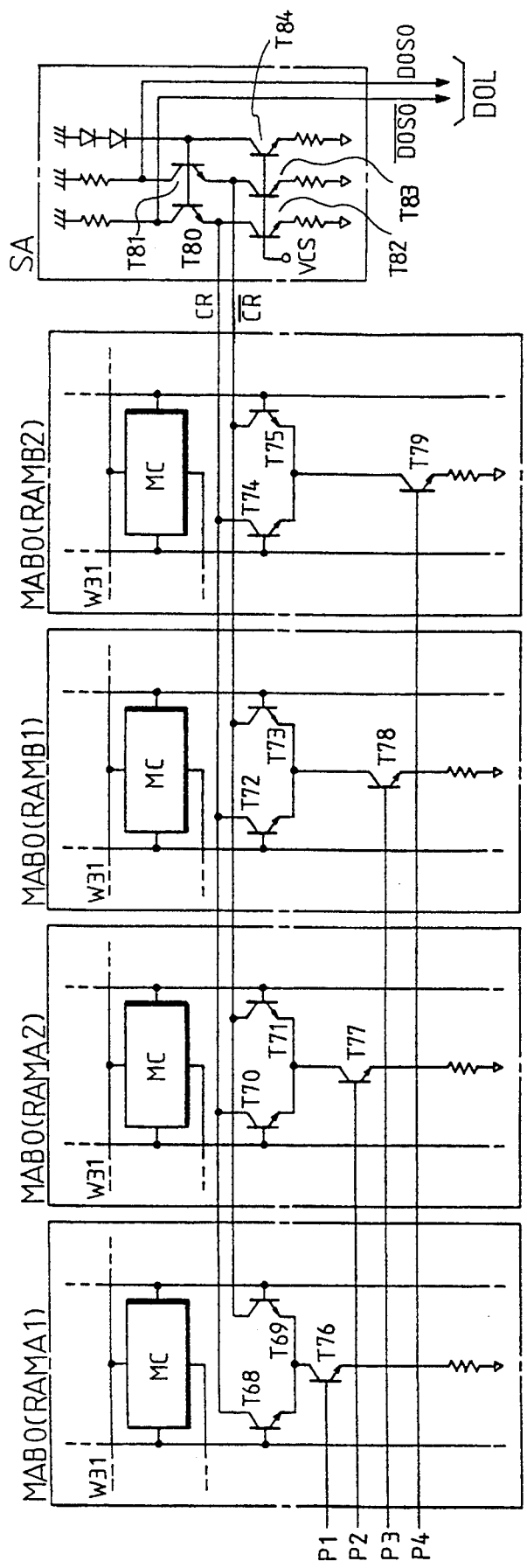
FIG. 25 is a circuit diagram showing the fourth embodiment of the output selector circuit (the sense amplifier having the output selecting function) which is included in the memory with logic functions in FIG. 17.

FIG. 22 shows a circuit diagram of the first embodiment of the output selector circuit DOSL, namely, the sense amplifier SA with an output selecting function (hereinbelow, termed "output selector circuit DOSL-(SA)") in the memory with logic functions to which this invention is applied. In addition, FIGS. 23 thru 25 show circuit diagrams of the second thru fourth embodiments of the output selector circuit DOSL(SA) to which this invention is applied. The practicable circuit arrangements and features of the sense amplifier having the output selecting function in the memory with logic functions to which this invention is applied, will be described with reference to these figures. By the way, the memory with logic functions here corresponds to FIG. 17, namely, to the memory with logic functions which adopts the 2-bank parallel shift access mode and which selects ¼ of the internal output data items.

Here, although no special restriction is intended, the output selector circuit DOSL(SA) comprises 27 pairs of unit selector circuits USLP0–USLP26 and USLN0–USLN26 which are disposed in correspondence with the non-inverted and inverted signals of the internal output data items DOS0–DOS26. These unit selector circuits have an identical circuit arrangement though not especially restricted. In the ensuing description, one pair of unit selector circuits USLP0 and USLN0 disposed in correspondence with the internal output data item DOS0 will be taken as an example. The other unit selector circuits USLP1–USLP26 and USLN1–USLN26 shall be inferred.

Referring to FIG. 22, each of the unit selector circuits USLP0 and USLN0 includes four sets of differential transistors T25, T26 thru T31, T32 which are disposed in correspondence with the non-inverted and inverted signals of internal output data items DO10 thru DO40 at the first bits of the random access memorier RAMA1 thru RAMA4, though no special restriction is meant. In the sets of differential transistors, the transistors T25, T27, T29 and T31 on one side have their collectors coupled in common and further coupled to the ground potential of the circuitry through a predetermined collector resistance, and they have their bases respectively supplied with corresponding pitch signals P1–P4. Besides, the transistors T26, T28, T30 and T32 on the other side have their collectors directly coupled to the ground potential of the circuitry, and they have their bases supplied with a predetermined reference potential VBB in common. Thus, the differential transistors T25, T26 thru T31, T32 construct a current switch circuit having the reference potential VBB as its logic threshold, for the pitch signals P1–P4.

Although no special restriction is intended, the emitters of the differential transistors T25, T26 thru T31, T32 coupled in common are respectively coupled to the power source voltage of the circuitry through transistors T35–T38, and transistors T40–T43 and their emitter resistances constructing regulated current sources. The emitters of the transistors T35–T38 are respectively coupled to corresponding internal output data lines $\overline{DOA10}$, $\overline{DOA20}$, $\overline{DOB10}$ and $\overline{DOB20}$, that is, the non-inverting or inverting signal lines of the complementary read signal lines $\overline{CR0}$ of the corresponding random access memories $\overline{RAMA1}$, RAMA2, RAMB1 and RAMB2. Also, although no special restriction is meant, the bases of the transistors T35–T38 coupled in common are coupled to the ground potential of the circuitry through two diodes in a series form, and they are also coupled to the power source voltage of the circuitry through a transistor T39 and its emitter resistance constructing a regulated current source. Thus, the transistors T35–T38 function as a clamp circuit for the non-inverted and inverted signals of the internal output data items DOA10, DOA20, DOB10 and DOB20.

The common-coupled collectors of the one-side transistors T25, T27, T29 and T31 in differential forms are further coupled to the base of a transistor T33. The collector of the transistor T33 is coupled to the ground potential of the circuitry, and the emitter thereof is coupled to the power source voltage of the circuitry through a transistor T34 and its emitter resistance constructing a regulated current source load. Thus, the transistor T33 constructs an output emitter follower circuit together with the transistor T34 which constitutes a regulated current source. The emitter potential of the transistor T33 is supplied to an output data latch DOL as the output signal of the output selector circuit DOSL(SA), that is, the non-inverted or inverted signal of the internal output data item DOS0.

When all the pitch signals P1-P4 are set at the low level lower than the reference potential VBB, the one-side transistors T25, T27, T29 and T31 in the differential forms are all brought into "off" states in the unit selector circuits USLP0 and USLN0. Consequently, the output signals of these unit selector circuits, namely, the non-inverted and inverted signals of the internal output data item DOS0 are both fixed to the high level such as the ground potential of the circuitry. In contrast, when the pitch signals P1-P4 are alternatively set at the high level higher than the reference potential VBB, the corresponding transistor T25, T27, T29 or T31 is alternatively brought into an "on" state, and it operates as a cascade circuit for the non-inverted or inverted signal of the complementary read signals $\overline{CR0}$, together with the clamp circuit configured of the transistors T35-T38. As a result, voltage signals which conform to the complementary read signals of the random access memory RAMA1, RAMA2, RAMB1 or RAMB2 designated by the pitch signals P1-P4 are produced at the output terminals of the unit selector circuits USLP0 and USLN0.

That is, the output selector circuit DOSL(SA) of this embodiment functions as the sense amplifier for the complementary read signals $\overline{CR0}$ of the corresponding random access memories RAMA1, RAMA2, RAMB1 and RAMB2, while at the same time, it functions as the output selector circuit for selecting the read signals in accordance with the pitch signals P1-P4. As a result, the circuit arrangement of the memory with logic functions is simplified, and the transfer delay times of the read signals are reduced to more shorten the cycle time of the memory with logic functions.

Meanwhile, the sense amplifier with the output selecting function, namely, the output selector circuit DOSL(SA) can adopt modifications as shown in FIGS. 23 thru 25. More specifically, in FIG. 23, each unit selector circuit of the output selector circuit DOSL-(SA) does not include the clamp circuit configured of the transistors T35-T38 in FIG. 22. Besides, in FIG. 24, the unit selector circuits USLP0 and USLN0 in FIGS. 22 or FIG. 23 are made unitary, and the read currents of selected memory cells MC are changed in the individual random access memories into voltage signals, which are transmitted to the differential amplifier circuits of the output selector circuit DOSL(SA) as configured of differential transistors T44, T45 thru T50, T51. These differential amplifier circuits are selectively brought into operating states in such a way that transistors T52, T54, T56 and T58 on one side, constituting a current switch circuit are selectively brought into "on" states in accordance with the pitch signals P1-P4. Accordingly, the differential amplifier circuits have also the function of an output selector circuit. Further, in FIG. 25, sensing transistors T68, T69-T74, T75 themselves are selectively brought into operating states in accordance with the pitch signals P1-P4, and the read signals of selected memory cells MC are applied to the bases of the corresponding sensing transistors as voltage signals. The above read signals are transmitted as current signals from the collector nodes of the sensing transistors coupled in common, to a sense amplifier SA, and the current signals are restored into voltage signals by a cascade circuit.

In each of the modified embodiments depicted in FIGS. 23 thru 25, the sense amplifier and the output selector circuit are made unitary, so that the cycle time of the memory with logic functions is similarly shortened.

As indicated by the foregoing embodiments, the following functional effects can be attained by applying this invention to a semiconductor integrated circuit device such as memory with logic functions in which RAM macrocells are packaged, a high-speed memory device such as a vector register which includes the memory with logic functions, and a digital processor such as high-speed computer which comprises the high-speed memory device:

(1) A high-speed memory device, such as a vector register, to be disposed in a high-speed computer or the like is basically constructed of a memory with logic functions, comprising n memories which are formed on an identical semiconductor substrate, the access time or cycle time of which is set n times as long as the machine cycle of the high-speed computer or the like, to which a series of consecutive address spaces are allocated successively and alternately, which are started sequentially every machine cycle, and which can operate in parallel. This brings forth the effect that the substantial cycle time of the memory with logic functions as viewed from the high-speed computer or the like can be reduced to one machine cycle irrespective of the operation modes thereof.

(2) The high-speed memory device is basically constructed of a memory with logic functions, comprising a pair of memories which are formed on an identical semiconductor substrate, to which a series of consecutive address spaces are allocated successively and alternately, and which are started alternately and simultaneously so that, when one of them is in a read mode, the other may be in a write mode. This brings forth the effect that write and read operations for a series of addresses as required in, for example, the processing of vector operations can be executed simultaneously and efficiently.

(3) The high-speed memory device is basically constructed of a memory with logic functions, comprising $(2 \times n)$ memories which are formed on an identical semiconductor substrate, to which a series of consecutive address spaces are allocated successively and alternately, which form two groups each consisting of n memories, and which are started simultaneously while the n memories constituting each group are sequentially shifted every machine cycle, so that one of two corresponding memories of the respective groups may be in a read mode and that the other may be in a write mode. This brings forth the effect that the substantial cycle time of the memory with logic functions as viewed from the high-speed computer or the like can be reduced to one machine cycle irrespective of the operation modes thereof, and the effect that write and read operations for a series of addresses as required in, for example, the processing of vector operations can be executed simultaneously, efficiently and quickly.

(4) Owing to the above item (1), (2) or (3), there are brought forth the effect that the cycle time of the memory with logic functions can be reduced accordingly, and the effect that the cycle time of the high-speed memory device such as a vector register can be shortened.

(5) Owing to the above item (4), there are brought forth the effect that the machine cycle of the high-speed computer or the like comprising the high-speed memory device can be shortened, and the effect that the processing capability thereof can be enhanced.

(6) Owing to the above item (1), (2) or (3), there are brought forth the effect that the storage capacity of the memory with logic functions, or the like can be enlarged without limiting the cycle time thereof, and the effect that the bit width and the number of addresses, of the high-speed memory device such as a vector register can be enlarged.

(7) Owing to the above item (6), there are brought forth the effect that the operating performance of the high-speed computer or the like comprising the high-speed memory device can be enhanced, and the effect that the overhead thereof can be curtailed.

(8) In a memory with logic functions, or the like comprising a plurality of memories which are selectively accessed for read operations, a sense amplifier for amplifying read signals is basically constructed of a plurality of pairs of transistors which are selectively brought into operating states in accordance with predetermined select signals. This brings forth the effect that the sense amplifier and an output selector circuit can be made unitary.

(9) Owing to the above item (8), there is brought forth the effect that the circuit arrangement of the output section of the memory with logic functions, or the like can be simplified.

(10) Owing to the above items (8) and (9), there are brought forth the effect that the transfer delay times of the read signals can be reduced, and the effect that the access time of the memory with logic functions, or the like can be more shortened.

(11) A plurality of random access memories are formed on an identical semiconductor substrate, and data inputs and address inputs to and data outputs from the individual random access memories are switched with internal clock signals Ki and/or pitch signals Pi, whereby data input terminals (PAD), address input terminals (PAD) and data output terminals (PAD) disposed on the semiconductor substrate can be shared by the plurality of random access memories. Thus, in a case where a memory device according to this invention is incorporated in a single package, for example, ceramic package, the number of pins to be provided in the package can be curtailed. Therefore, reduction in the area of a printed-wiring circuit board can be achieved owing to the miniaturization of the package based on the curtailment of the number of pins of the packaged memory device. Consequently, the volume of a digital processor, for example, a computer proper can be reduced, and the cost thereof can be lowered. Further, it will be readily understood that the volume of the computer proper is reduced for the above reasons when the number of address input terminals, per se, is curtailed by incorporating address counters ACW and ACR into the memory device itself as illustrated in FIG. 15.

Figure 20:
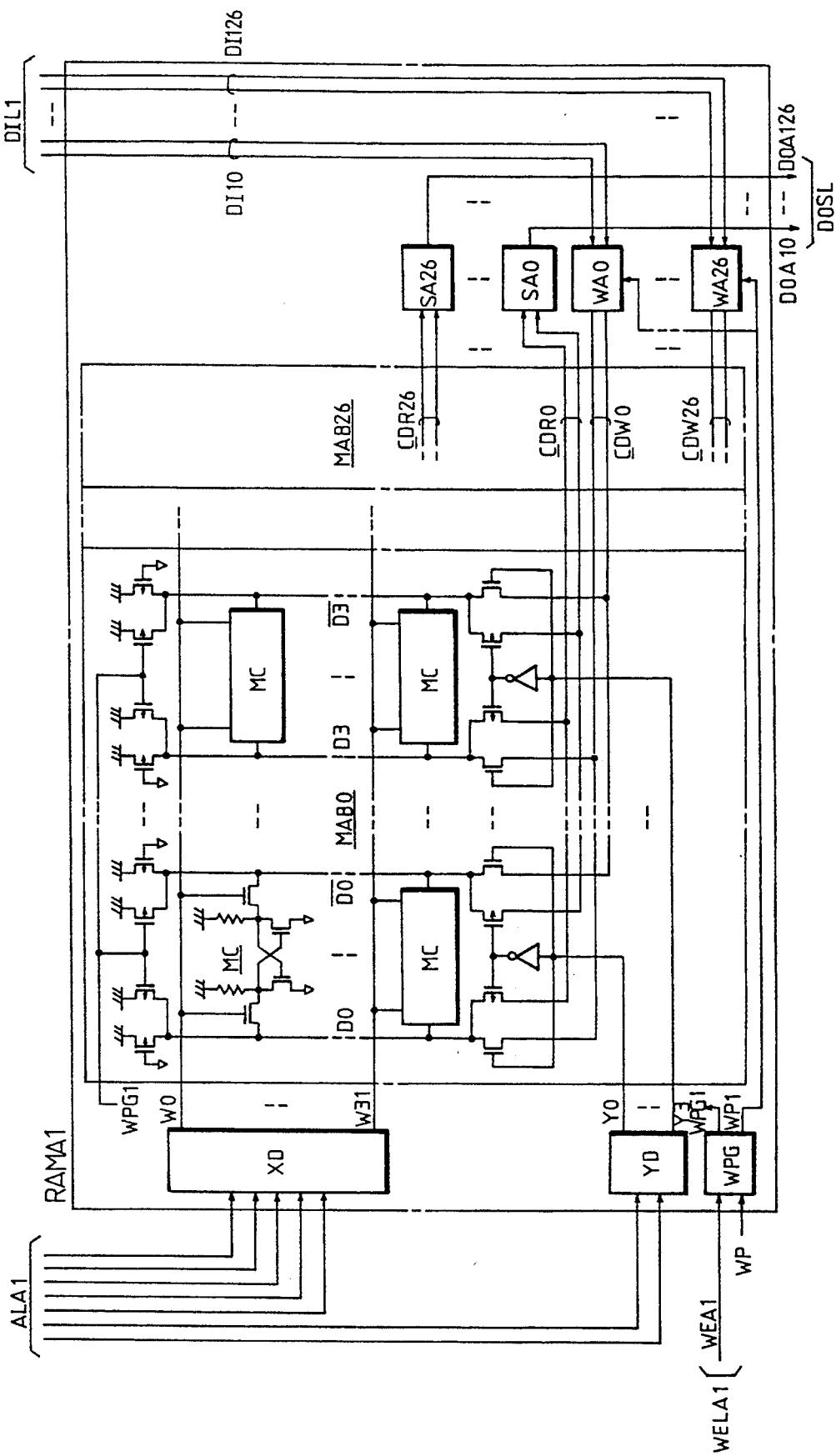
FIG. 20 is a circuit block diagram showing the second embodiment of the RAM macrocell which is included in the memory with logic functions in FIG. 13.

Although, in the above, the invention made by the inventors has been concretely described in conjunction with embodiments, it is needless to say that this invention is not restricted to the foregoing embodiments, but that it can be variously altered within a scope not departing from the purport thereof. By way of example, in the fundamental conceptual diagrams and block diagrams of FIGS. 1 thru 17, the address latches, input data latches, write enable signal latches, etc. to be disposed in correspondence with the individual random access memories may well be respectively arranged within the corresponding random access memories. Besides, the memory with logic functions may well include two or more sets of the functional units each consisting of the plurality of memories as shown in the fundamental conceptual diagrams and block diagrams. In each embodiment, the memory management unit, which forms the internal clock signals, pitch signals and write enable signals on the basis of the address signals of predetermined bits, is disposed outside the memory with logic functions, but it may well be mounted inside the memory with logic functions. The plurality of memories to be mounted in the memory with logic functions may well be read-only memories. Besides, each memory may well be a CMOS type static RAM as shown in FIG. 20 by way of example. In this case, even when the cycle time of each random access memory is set to be considerably long, the substantial cycle time of the memory with logic functions can be held in correspondence with the machine cycle of the high-speed computer by increasing the number n of the random access memories. Thus, the storage capacity of the high-speed memory device or the like can be more enlarged, and the overhead of the high-speed computer or the like can be curtailed. By the way, in case of employing high-resistance load type NMOS static cells made of polycrystalline silicon as illustrated in FIG. 20, an X address decoder XD and a Y address decoder YD for the cells may be constructed of bipolar transistors as in the X address decoder XD in FIG. 21. This construction is effective because the cycle time of such an address decoder is made shorter than that of the conventional CMOS type static RAM. In this case, the output selector circuit DOSL(SA) constructed of the bipolar transistors as shown in any of FIGS. 22 thru 25 is applied as a matter of course. Moreover, since the high-resistance load type NMOS cells mentioned above can be raised in the density of integration, they are effective for enlarging the storage capacity of each memory. Further, each memory cell in FIG. 20 may well be a CMOS type static cell. The CMOS type static cell can be formed in such a way that a pair of resistance elements in the memory cell in FIG. 20 are respectively replaced with P-channel MOSFETS, thereby to construct a pair of CMOS inverter circuits the inputs and outputs of which are cross-coupled to each other. In the timing charts of FIGS. 2 thru 14, the temporal relations of the address signals, input data items, internal clock signals, pitch signals, etc. are not restricted by these embodiments. Besides, the address signals to be afforded to the memory with logic functions need not especially be consecutive, but they can be designated at random as long as the phasic relations of the internal clock signals, pitch signals, etc. are kept. In FIG. 18, the plurality of random access memories may well be aligned in the vertical or horizontal direction of the figure, and the layout of the various circuits including these random access memories is at will. Besides, the bonding pads PAD may well be disposed at, for example, only the upper and lower parts or the right and left parts of the semiconductor substrate SUB, or they may well be disposed at the central part thereof. The shape of the semiconductor substrate SUB need not especially be a regular square. In FIG. 19, any desired array scheme can be adopted for the memory array blocks of each random access memory. In addition, regarding the X address decoder XD, Y address decoder YD, etc., a plurality of such elements may well be disposed so that each element may correspond to several memory array blocks. The practicable circuit arrangements of the memory array blocks, memory cells, X address decoder, etc. shown in FIGS. 19 and 21 are not restricted by these embodiments. In FIGS. 22 thru 25, the practicable circuit arrangement of the output selector circuit DOSL(SA) or sense amplifier SA is at will. Moreover, various practicable method will be considered for endowing the sense amplifier with the output selecting function. In the individual circuit diagrams, various aspects of performance can be employed as regards the polarity and absolute value of the power source voltage, the conductivity typos of the bipolar transistors and MOSFETs, etc.

In the above, the invention made by the inventors has been chiefly described with regard to the applications to memories with logic functions, vector registers and high-speed computers which form the background field of utilization thereof. However, this invention is not restricted to them, but it is also applicable to, for example, a gate array integrated circuit device or a dedicated logic integrated circuit device including a plurality of RAM macrocells, a high-speed memory device such as a cache memory or buffer memory, and various digital controllers each comprising the high-speed memory device. This invention is extensively applicable to a semiconductor integrated circuit device having, at least, a plurality of memories incorporated therein, a memory device including such a semiconductor integrated circuit device, and a digital processor comprising such a memory device.

Effects which are attained by a typical aspect of performance of this invention are briefly explained as follows: A high-speed memory device, such as vector register, to be disposed in a high-speed computer or the like is basically constructed of a memory with logic functions, or the like comprising n memories which are formed on an identical semiconductor substrate, the access time or cycle time of which is set n times as long as the machine cycle of the high-speed computer or the like, to which address spaces not overlapping each other are allocated, and which can operate in parallel. Thus, while the substantial access time and cycle time of the memory with logic functions, are shortened, the storage capacity thereof can be enlarged. As a result, the machine cycle of the high-speed computer or the like comprising the high-speed memory device can be shortened, and the processing capability and operating performance thereof can be enhanced.

What is claimed is:

1. A semiconductor integrated circuit device comprising:
    a plurality of memory blocks each including:
    a plurality of memory cells,
    a plurality of word lines and a plurality of data lines which are coupled to said memory cells in such a manner that one memory cell is coupled to one word line and one data line, and
    decoder means coupled to said plurality of word lines and said plurality of data lines for bringing one of said plurality of word lines and at least one of said plurality of data lines into selected states on the basis of address signals;
    wherein the number of said plurality of memory blocks is n, and a cycle time $t_c$ required for one of a read operation and a write operation of said each of said memory blocks is set at:

$$t_c \leq n \times t_{mc}$$

where $t_{mc}$ denotes a machine cycle of a digital processor, and
    wherein said plurality of memory blocks are started sequentially every machine cycle of said digital processor.

2. A semiconductor integrated circuit device comprising:
    first and second memory banks each including a plurality of memory blocks, wherein each memory block includes:
    a plurality of memory cells,
    a plurality of word lines and a plurality of pairs of data lines which are coupled to said memory cells in such a manner that one memory cell is coupled to one word line and one pair of data lines, and
    decoder means coupled to said plurality of word lines and said plurality of pairs of data lines for bringing one of said plurality of word lines and at least one of said plurality of pairs of data lines into selected states on the basis of address signals applied thereto;
    wherein the number of said plurality of memory blocks in each of said first and second memory banks is n,
    wherein the respective memory blocks of said first memory bank and the respective memory blocks of said second memory bank are formed as individual pairs so that one of said plurality of memory blocks in said first memory bank is in a read operation, while one of said plurality of memory blocks in said second memory bank which forms one pair with respect to the one of said plurality of memory blocks in said first memory bank is in a write operation,
    wherein said plurality of memory blocks of each of said first and second memory banks are started sequentially every machine cycle of a digital processor, and wherein a cycle time $t_c$ required for a read operation or a write operation of said plurality of memory blocks of each of said first and second memory banks is set at:

$$t_c \leq n \times t_{mc}$$

where $t_{mc}$ denotes a machine cycle of said digital processor.

3. A semiconductor integrated circuit device according to claim 2, wherein each of said first and second memory banks are set at the read operation and the write operation alternately.

4. A semiconductor integrated circuit device according to claim 3, further comprising a plurality of address counters which form address signals for the read operation and the write operation.

5. A semiconductor integrated circuit device according to claim 2, further comprising a sense amplifier which receives and amplifies a selected one of read signals of said plurality of memory blocks in accordance with a predetermined select signal.

6. A semiconductor integrated circuit device according to claim 5, wherein said sense amplifier includes a plurality of differentially connected pairs of bipolar transistors, having collectors selectively coupled in common.

7. A semiconductor integrated circuit device according to claim 1, wherein said plurality of memory blocks are formed on one semiconductor substrate.

8. A semiconductor integrated circuit device according to claim 1, wherein said memory cells include flip-flops, respectively.

9. A semiconductor integrated circuit device according to claim 8, wherein each of said flip-flops is comprised of bipolar transistors.

10. A semiconductor integrated circuit device according to claim 1, further comprising:
sense means coupled to said plurality of memory blocks and responsive to a selection signal for amplifying a selected one of the read signals of said plurality of memory blacks.

11. A semiconductor integrated circuit device according to claim 2, wherein said plurality of memory blocks are formed on one semiconductor substrate.

12. A semiconductor integrated circuit device according to claim 2, wherein said memory cells include flip-flops, respectively.

13. A semiconductor integrated circuit device according to claim 12, wherein each of said flip-flops is comprised of bipolar transistors.

14. A semiconductor integrated circuit device comprising:
first and second memory blocks which are controlled so that one of said first and second memory blocks is in a read mode, while the other of said first and second memory blocks is in a write mode, each of said first and second memory blocks includes:
a plurality of memory cells;
a plurality of word lines and a plurality of pairs of data lines which are coupled to said memory cells in such a manner that one memory cell is coupled to one word line and one pair of sad plurality of pairs of data lines, and
decoder means coupled to said plurality of word lines and said plurality of pairs of data lines for bringing one of said plurality of word lines and at least one pair of said plurality of pairs of data lines into selected states on the basis of address signals applied thereto; and
sense means responsive to a selection signal and for amplifying selected ones of first read signals of said first memory block and second read signals of said second memory block, wherein said sense means includes:
a first circuit including first differentially connected bipolar transistors for amplifying one of said first read signals and second differentially connected bipolar transistors for amplifying one of said second read signals, and
a second circuit including a third differentially connected bipolar transistors for amplifying another of said first read signals and a fourth differentially connected bipolar transistors for amplifying another of said second read signals,
wherein a collector of one of said first differentially connected bipolar transistors and a collector of one of said second differentially connected bipolar transistors are coupled in common,
wherein a collector of one of said third differentially connected bipolar transistors and a collector of one of said fourth differentially connected bipolar transistors are coupled in common,
wherein bases of the one of said first differentially connected bipolar transistors and the one of said third differentially connected bipolar transistors are coupled to receive a first selecting signal of said selection signal, and
wherein bases of the one of said second differentially connected bipolar transistors and the one of said fourth differentially connected bipolar transistors are coupled to receive a second selecting signal of said selection signal.

15. A semiconductor integrated circuit device according to claim 14, wherein said plurality of memory cells are static type memory cells which include flip-flop circuits, respectively.

16. A semiconductor integrated circuit device according to claim 15, wherein said flip-flop circuits are comprised of bipolar transistors, respectively.

17. A semiconductor integrated circuit device according to claim 15, wherein said flip-flop circuits are comprised of MOSFETs, respectively.

18. A semiconductor integrated circuit device according to claim 8, wherein said plurality of memory blocks include one pair of memory blocks, and a cycle time $t_c$ required for a read operation and a write operation of said pair of memory blocks is set at:

$$t_c \leq n \times t_{mc}$$

where $t_{mc}$ denotes a machine cycle of said digital processor, and wherein said pair of memory blocks are simultaneously started so as to bring one of them into a read mode and the other into a write mode.

19. A semiconductor integrated circuit device according to claim 18, wherein each of said pair of memory blocks has its operation mode set at the read mode and the write mode alternately.

* * * * *